(12) United States Patent
Lee et al.

(10) Patent No.: US 12,016,216 B2
(45) Date of Patent: Jun. 18, 2024

(54) DISPLAY DEVICE WITH IMPROVED DISPLAY CHARACTERISTICS AT A CORNER THEREOF

(71) Applicant: Samsung Display Co., Ltd., Yongin-si (KR)

(72) Inventors: Sun Hwa Lee, Yongin-si (KR); Yu Jin Lee, Suwon-si (KR); Gyung Soon Park, Seoul (KR); Jae Yong Jang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 507 days.

(21) Appl. No.: 17/224,594

(22) Filed: Apr. 7, 2021

(65) Prior Publication Data

US 2022/0052141 A1 Feb. 17, 2022

(30) Foreign Application Priority Data

Aug. 17, 2020 (KR) .......................... 10-2020-0102907

(51) Int. Cl.
| | |
|---|---|
| *H10K 59/131* | (2023.01) |
| *H10K 50/813* | (2023.01) |
| *H10K 50/822* | (2023.01) |
| *H10K 59/123* | (2023.01) |
| *H10K 59/124* | (2023.01) |

(52) U.S. Cl.
CPC ......... *H10K 59/131* (2023.02); *H10K 50/813* (2023.02); *H10K 50/822* (2023.02); *H10K 59/123* (2023.02); *H10K 59/124* (2023.02)

(58) Field of Classification Search
CPC .. H10K 29/131; H10K 29/124; H10K 29/123; H10K 50/822; H10K 50/813
See application file for complete search history.

(56) References Cited

U.S. PATENT DOCUMENTS

2017/0337873 A1* 11/2017 Kim ..................... G09G 3/3233
2021/0318770 A1 10/2021 Joo et al.

FOREIGN PATENT DOCUMENTS

KR 2021-0127281 A 10/2021

* cited by examiner

*Primary Examiner* — Lex H Malsawma
(74) *Attorney, Agent, or Firm* — Lewis Roca Rothgerber Christie LLP

(57) ABSTRACT

Provided is a display device including a substrate including a front surface portion, a first side surface portion extending from a first side of the front surface portion, a second side surface portion extending from a second side of the front surface portion, and a corner portion between the first side surface portion and the second side surface portion, a first display area on the front surface portion of the substrate, and including a first pixel for displaying images, and a second display area on the corner portion of the substrate, and including a first voltage supply line, and a second pixel for displaying images, the second pixel including a first pixel electrode, a first light emitting layer on the first pixel electrode, and a common electrode on the first light emitting layer, wherein the first voltage supply line does not overlap the first pixel electrode in a thickness direction of the substrate.

23 Claims, 18 Drawing Sheets

DISPLAY DEVICE WITH IMPROVED DISPLAY CHARACTERISTICS AT A CORNER THEREOF

CROSS-REFERENCE TO RELATED APPLICATION

This application claims priority to, and the benefit of, Korean Patent Application No. 10-2020-0102907, filed on Aug. 17, 2020, in the Korean Intellectual Property Office (KIPO), the entire content of which is incorporated by reference herein.

BACKGROUND

1. Field

The present disclosure relates to a display device.

2. Description of the Related Art

As the information-oriented society evolves, various demands for display devices are ever increasing. For example, display devices are being employed by a variety of electronic devices such as smart phones, digital cameras, laptop computers, navigation devices, and smart televisions.

Display devices may be flat panel display devices, such as a liquid-crystal display device, a field emission display device, and a light-emitting display device. Light-emitting display devices include an organic light-emitting display device including an organic light-emitting element, an inorganic light-emitting display device including an inorganic light-emitting element such as an inorganic semiconductor, and/or a micro-LED display device including ultra-small light-emitting elements.

As display devices are employed by various electronic devices, display devices may suitably have various designs. For example, when the display device is a light-emitting display device, images may be displayed not only on the front surface portion but also on the side surface portions bent at the four edges of the front surface portion, respectively. For example, such a display device may include a corner portion located between the first side surface portion bent at a first side edge of the front surface portion and the second side surface portion bent at a second side edge of the front surface portion. A high strain may be applied to the corner portion due to the double curvature (e.g., the curvature of the first side surface portion and the curvature of the second side surface portion).

SUMMARY

Aspects of some embodiments of the present disclosure provide a display device which can reduce or prevent recognition, by a user, of a region between a display area of a front surface portion of the display device and a display area of a corner portion of the display device where images can be displayed.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to some embodiments of the present disclosure, there is provided a display device including a substrate including a front surface portion, a first side surface portion extending from a first side of the front surface portion, a second side surface portion extending from a second side of the front surface portion, and a corner portion between the first side surface portion and the second side surface portion, a first display area on the front surface portion of the substrate, and including a first pixel for displaying images, and a second display area on the corner portion of the substrate, and including a first voltage supply line, and a second pixel for displaying images, the second pixel including a first pixel electrode, a first light emitting layer on the first pixel electrode, and a common electrode on the first light emitting layer, wherein the first voltage supply line does not overlap the first pixel electrode in a thickness direction of the substrate.

The second pixel may be between an edge of the substrate and the first voltage supply line.

The first voltage supply line may define a pixel hole in which the first pixel electrode is located.

The first voltage supply line may further define a first hole spaced from the pixel hole.

A size of the pixel hole may be larger than a size of the first hole.

The second pixel may further include a second pixel electrode spaced from the first pixel electrode, and a second light emitting layer on the second pixel electrode.

The second pixel electrode may be in another pixel hole apart from the pixel hole.

The display device may further include a transistor between the first display area and the second display area, and configured to drive the second pixel.

The display device may further include a first planarization layer on the transistor, pixel connection lines on the first planarization layer, and a second planarization layer on the pixel connection lines.

The first pixel electrode and the second pixel electrode may be on the second planarization layer, wherein the pixel connection lines include a first pixel connection line connected to the first pixel electrode through a first pixel contact hole penetrating the second planarization layer, and a second pixel connection line connected to the second pixel electrode through a second pixel contact hole penetrating the second planarization layer.

The first pixel connection line may overlap the second pixel electrode in the thickness direction of the substrate.

The first pixel connection line and the second pixel connection line may overlap the first voltage supply line in the thickness direction of the substrate.

The display device may further include a first voltage connection electrode on the first planarization layer, and connected to the first voltage supply line through a first voltage connection contact hole penetrating through the first planarization layer and the second planarization layer.

The first pixel electrode and the second pixel electrode might not overlap the first voltage connection electrode in the thickness direction of the substrate.

The display device may further include an active layer of the transistor on the substrate, a gate insulator on the active layer of the transistor, a gate electrode of the transistor on the gate insulator, a first insulating layer on the gate electrode of the transistor, a source electrode of the transistor on the first insulating layer, and connected to the active layer of the transistor through a source contact hole penetrating the first insulating layer, and a drain electrode of the transistor on the first insulating layer, and connected to the active layer of the transistor through a drain contact hole penetrating the first insulating layer.

The display device may further include a second voltage supply line connected to the first voltage supply line through the first voltage connection contact hole in a non-display area of the first side surface portion.

The first planarization layer may be on the source electrode and the drain electrode of the transistor, wherein the second voltage supply line is on the first planarization layer.

The display device may further include a third voltage supply line connected to the first voltage supply line through the first voltage connection contact hole in the second display area, and located in the non-display area of the first side surface portion.

The third voltage supply line may be on the first insulating layer.

The first display area may further include scan lines extending in a direction, wherein the second display area further includes scan driving transistors for outputting scan signals to the scan lines.

At least one of the first pixel electrode and the second pixel electrode may overlap at least one of the scan driving transistors in the thickness direction of the substrate.

The first voltage supply line may overlap at least one of the scan driving transistors in the thickness direction of the substrate.

According to some embodiments of the present disclosure, there is provided a display device including a substrate including a front surface portion, a first side surface portion extending from a first side of the front surface portion, a second side surface portion extending from a second side of the front surface portion, and a corner portion between the first side surface portion and the second side surface portion, a first display area on the front surface portion of the substrate, and including a first pixel for displaying images, a second display area on the corner portion of the substrate, and including a first voltage supply line and a second pixel for displaying images, a transistor between the first display area and the second display area, and configured to drive the second pixel, and a pixel connection line for connecting a pixel electrode of the second pixel to a source electrode or a drain electrode of the transistor.

The pixel connection line may overlap the first voltage supply line in a thickness direction of the substrate.

According to the aforementioned and other embodiments of the present disclosure, in a display device having a corner portion where a third display area for displaying images is located, a second display area is further located between a first display area of the front surface portion and the third display area of the corner portion. Therefore, it is possible to reduce or prevent recognition, by a user, of a gap between the image displayed by the first display area on the front surface portion and the image displayed by the third display area at the corner portion.

According to the aforementioned and other embodiments of the present disclosure, each of the pixels displaying images in the second display area may be located in a pixel hole of a first voltage supply line. Therefore, the pixels in the second display area can be located so that they avoid the first voltage supply line.

According to the aforementioned and other embodiments of the present disclosure, a pixel driver including thin-film transistors for supplying driving current or driving voltage to light-emitting elements of the pixels in the second display area is located between the first voltage supply line and the first display area. In addition, the light-emitting elements of the pixels in the second display area are connected to the thin-film transistors of the pixel driver through pixel connection lines. Accordingly, the thin-film transistors of the pixel driver may be located so that they avoid the scan driver transistors of the scan driver located in the second display area.

According to the aforementioned and other embodiments of the present disclosure, pixels are not located in the non-display area of the side surface portion, and thus the first voltage supply line include no pixel hole. In addition, it is not necessary to connect the thin-film transistor of the pixel driver with the pixel electrode of the pixel in the non-display area, and thus no pixel connection line is required. Therefore, the second voltage supply line may be located in the non-display area instead of the pixel connection line, so that the resistance of the voltage supply line can be lowered.

According to the aforementioned and other embodiments of the present disclosure, a display device further includes a second voltage connection electrode connected to the first voltage supply line through the voltage connection contact hole in the second display area, so that the resistance of the voltage supply line can be reduced.

BRIEF DESCRIPTION OF THE DRAWINGS

The above and other embodiments and features of the present disclosure will become more apparent by describing embodiments thereof with reference to the attached drawings, in which.

DETAILED DESCRIPTION

Figure 1:
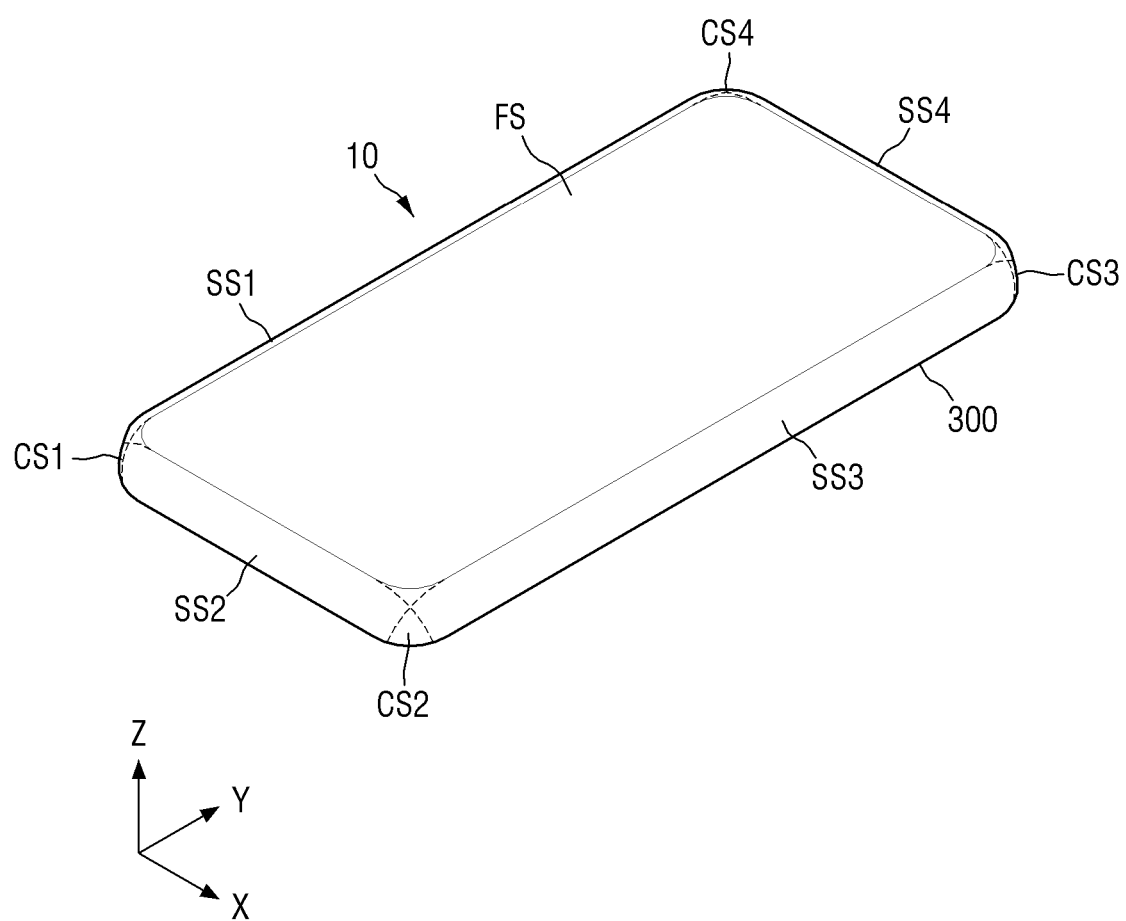
FIG. 1 is a perspective view of a display device according to some embodiments of the present disclosure.

Aspects of some embodiments of the present disclosure and methods of accomplishing the same may be understood more readily by reference to the detailed description of embodiments and the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all sub-ranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, embodiments of the present disclosure will be described with reference to the attached drawings.

Figure 2:
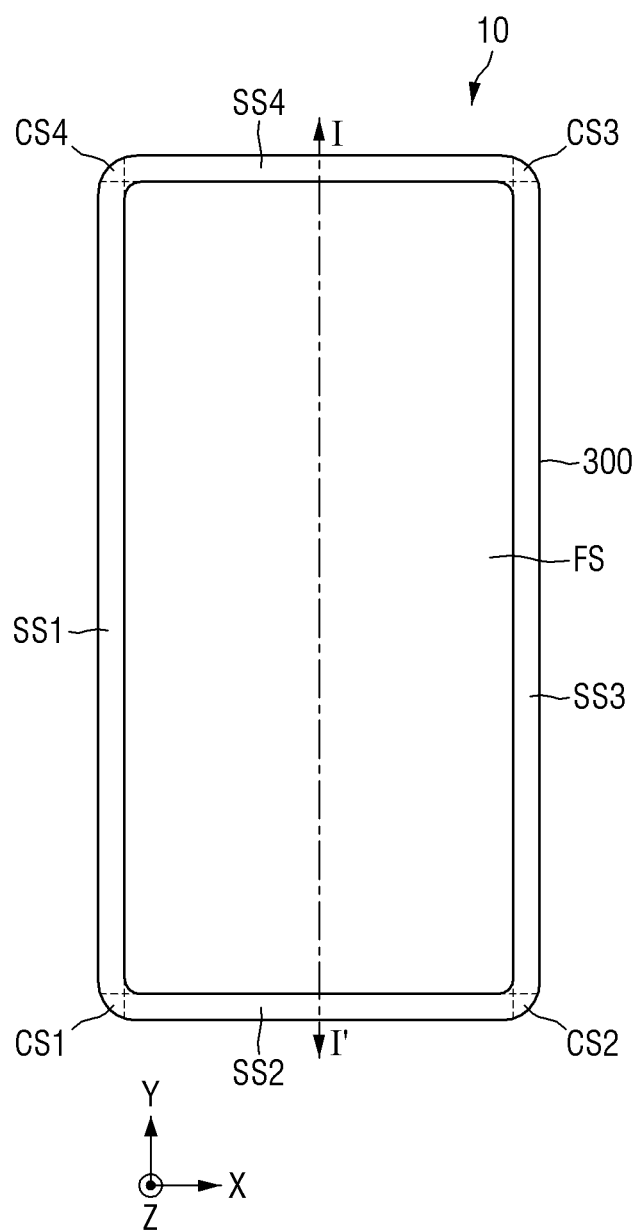
FIG. 2 is a plan view showing a display device according to some embodiments of the present disclosure.

FIG. 1 is a perspective view of a display device according to some embodiments of the present disclosure. FIG. 2 is a plan view showing a display device according to some embodiments of the present disclosure.

Referring to FIGS. 1 and 2, a display device 10 according to some embodiments of the present disclosure may be employed by portable electronic devices, such as a mobile phone, a smart phone, a tablet PC, a mobile communications terminal, an electronic notebook, an electronic book, a portable multimedia player (PMP), a navigation device and an ultra-mobile PC (UMPC). Alternatively, the display device 10 according to some embodiments of the present disclosure may be used as a display unit of a television, a laptop computer, a monitor, an electronic billboard, or the Internet of Things (IOT). Alternatively, the display device 10 according to some embodiments of the present disclosure may be applied to wearable devices such as a smart watch, a watch phone, a glasses-type display, and a head-mounted display (HMD) device. Alternatively, the display device 10 according to some embodiments may be used as a center information display (CID) located at the instrument cluster, the center fascia, or the dashboard of a vehicle, as a room mirror display on the behalf of the side mirrors of a vehicle, and/or as a display placed on the back of each of the front seats that is an entertainment system for passengers at the rear seats of a vehicle.

As used herein, the first direction (x-axis direction) may be parallel to the shorter sides of the display device 10, for example, the horizontal direction of the display device 10 when viewed from the top. The second direction (y-axis direction) may be parallel to the longer sides of the display device 10, for example, the vertical direction of the display device 10 when viewed from the top. The third direction (z-axis direction) may refer to the thickness direction of the display device 10.

The display device 10 according to some embodiments may include a display panel 300. As shown in FIGS. 1 and 2, the display panel 300 may include a front surface portion FS, a first side surface portion SS1, a second side surface portion SS2, a third side surface portion SS3, a fourth side surface portion SS4, a first corner portion CS1, a second corner portion CS2, a third corner portion CS3, and a fourth corner portion CS4.

The display panel 300 may include a flexible substrate that can be bent, folded, or rolled. For example, the substrate SUB may be made of polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP) or a combination thereof. Alternatively, the substrate SUB may include a metallic material. In addition, only a part of the substrate SUB may be flexible, or the entire area of the substrate SUB may be flexible.

The front surface portion FS may have, but is not limited to, a rectangular shape having shorter sides in the first direction (x-axis direction) and longer sides in the second direction (y-axis direction) when viewed from the top. The front surface portion FS may have other polygonal shape, a circular shape or an oval shape when viewed from the top. Although the front surface portion FS is flat in the embodiments shown in FIGS. 1 and 2, the present disclosure is not limited thereto. The front surface portion FS may include a curved surface.

The first side surface portion SS1 may be extending from a first side of the front surface portion FS. The first side surface portion SS1 may be bent along a first bending line BL1 (see FIG. 3) on the first side of the front surface portion FS, and accordingly may have a first curvature. The first side of the front surface portion FS may be the left side of the front surface portion FS as shown in FIGS. 1 and 2.

The second side surface portion SS2 may be extending from a second side of the front surface portion FS. The second side surface portion SS2 may be bent along a second bending line BL2 (see FIG. 3) on the second side of the front surface portion FS and accordingly may have a second curvature. The second curvature may be different from the first curvature, but the present disclosure is not limited thereto. The second side of the front surface portion FS may be the lower side of the front surface portion FS as shown in FIGS. 2 and 2.

The third side surface portion SS3 may be extending from a third side of the front surface portion FS. The third side surface portion SS3 may be bent along a third bending line BL3 (see FIG. 3) on the third side of the front surface portion FS and accordingly may have a third curvature. The third curvature may be different from the second curvature, but the present disclosure is not limited thereto. The third side of the front surface portion FS may be the right side of the front surface portion FS as shown in FIGS. 1 and 2.

The fourth side surface portion SS4 may be extending from a fourth side of the front surface portion FS. The fourth side surface portion SS4 may be bent along a fourth bending line BL4 (see FIG. 3) on the fourth side of the front surface portion FS and accordingly may have a fourth curvature. The fourth curvature may be different from the first curvature, but the present disclosure is not limited thereto. The fourth side of the front surface portion FS may be the upper side of the front surface portion FS as shown in FIGS. 1 and 2.

The first corner portion CS1 may be located between the first side surface portion SS1 and the second side surface portion SS2. For example, the first corner portion CS1 may be in contact with the lower side of the first side surface portion SS1 and the left side of the second side surface portion SS2. The first corner portion CS1 may have double curvature due to the first curvature of the first side surface portion SS1 and the second curvature of the second side surface portion SS2. Accordingly, a strain may be applied to the first corner portion CS1 by a bending force by the first curvature of the first side surface portion SS1 and by a bending force by the second curvature of the second side surface portion SS2.

The second corner portion CS2 may be located between the second side surface portion SS2 and the third side surface portion SS3. For example, the second corner portion CS2 may be in contact with the right side of the second side surface portion SS2 and the lower side of the third side surface portion SS3. The second corner portion CS2 may have double curvature due to the second curvature of the second side surface portion SS2 and the third curvature of the third side surface portion SS3. Accordingly, a strain may be applied to the second corner portion CS2 by a bending force by the second curvature of the second side surface portion SS2 and by a bending force by the third curvature of the third side surface portion SS3.

The third corner portion CS3 may be located between the third side surface portion SS3 and the fourth side surface portion SS4. For example, the third corner portion CS3 may be in contact with the upper side of the third side surface portion SS3 and the right side of the fourth side surface portion SS4. The third corner portion CS3 may have double curvature due to the third curvature of the third side surface portion SS3 and the fourth curvature of the fourth side surface portion SS4. Accordingly, a strain may be applied to the third corner portion CS3 by a bending force by the third curvature of the third side surface portion SS3 and by a bending force by the fourth curvature of the fourth side surface portion SS4.

The fourth corner portion CS4 may be located between the first side surface portion SS1 and the fourth side surface portion SS4. For example, the fourth corner portion CS4 may be in contact with the upper side of the first side surface portion SS1 and the left side of the fourth side surface portion SS4. The fourth corner portion CS4 may have double curvature due to the first curvature of the first side surface portion SS1 and the fourth curvature of the fourth side surface portion SS4. Accordingly, a strain may be applied to the fourth corner portion CS4 by a bending force by the first curvature of the first side surface portion SS1 and by a bending force by the fourth curvature of the fourth side surface portion SS4.

Figure 5:
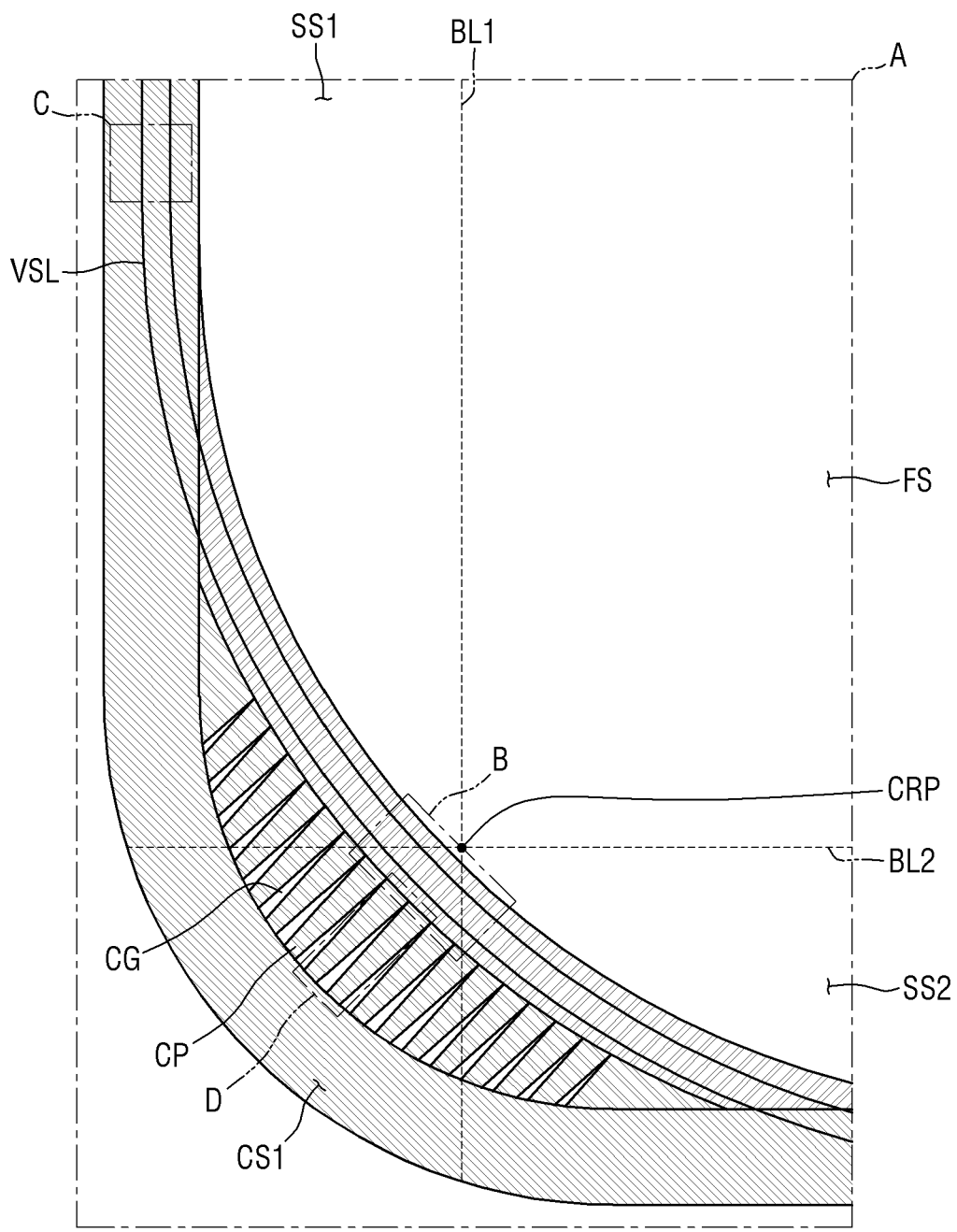
FIG. 5 is a layout diagram showing the first to third display areas and the non-display area located at the first corner portion of the display panel according to the exemplary embodiment of the present disclosure.

Each of the first corner portion CS1, the second corner portion CS2, the third corner portion CS3 and the fourth corner portion CS4 may include cut patterns that are separated by cutting grooves to reduce the strain due to the double curvature, as shown in FIG. 5. The cut patterns will be described later with reference to FIG. 5.

Figure 3:
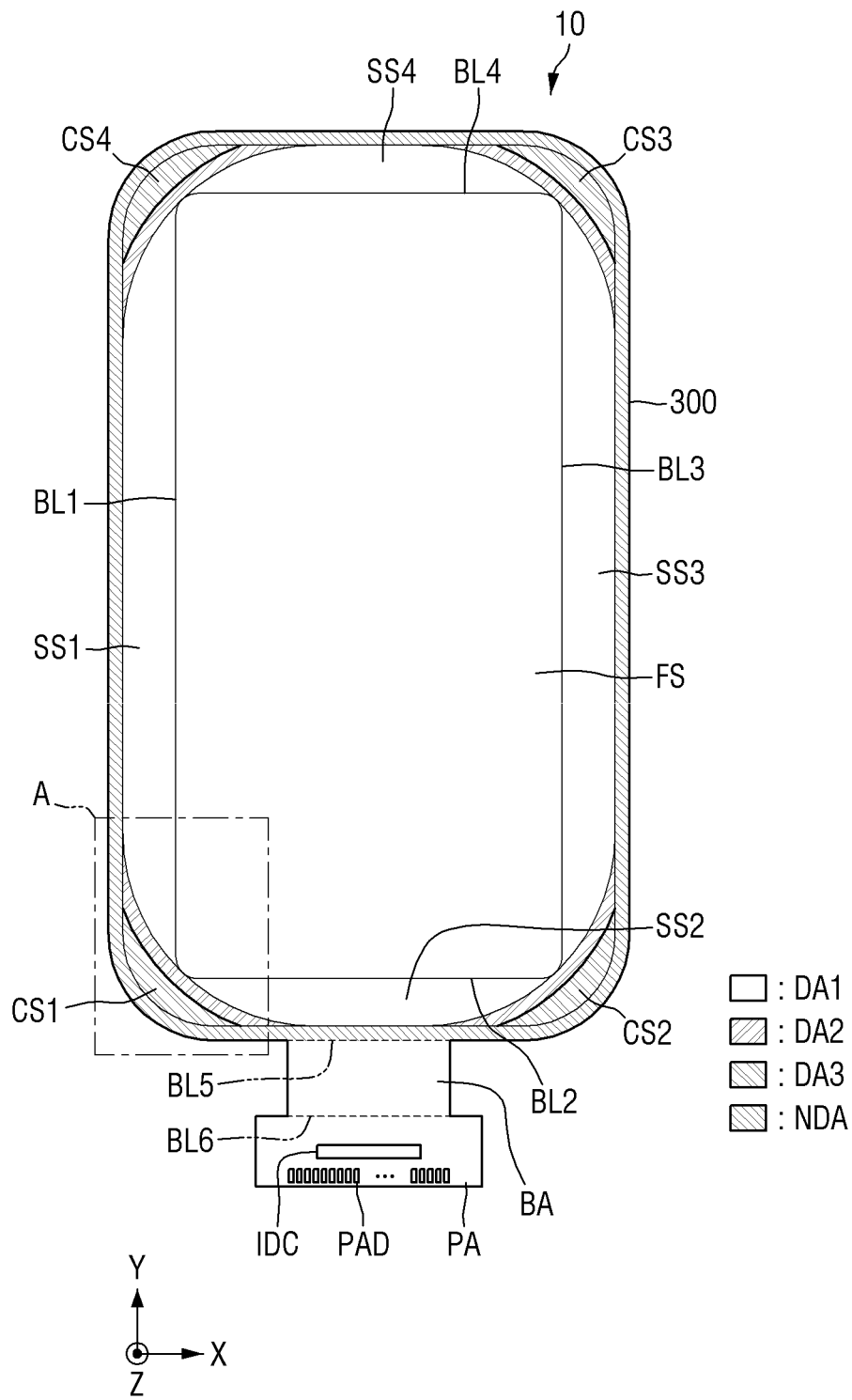
FIG. 3 is a development view showing a display device according to some embodiments of the present disclosure.

FIG. 3 is a development view showing a display device according to some embodiments of the present disclosure.

Referring to FIG. 3, the display panel 300 may further include a bending area BA and a pad area PA. The display panel 300 may include first to third display areas DA1 to DA3, a non-display area NDA, the bending area BA, and the pad area PA.

The first to third display areas DA1 to DA3 include pixels or emission areas to display images. The non-display area NDA does not include pixels or emission areas and does not display images. In the non-display area NDA, signal lines or scan driver for driving the pixels or the emission areas may be located.

The first display area DA1 may be the main display area of the display panel 300 and may include a front surface portion FS, a part of the first side surface portion SS1, a part of the second side surface portion SS2, a part of the third side part SS3 and a part of the side surface portion SS4. The part of the first side surface portion SS1 is extending from the first side of the front surface portion FS, and the part of the second side surface portion SS2 is extending from the second side of the front surface portion FS. The part of the third side surface portion SS3 is extending from the third side of the front surface portion FS, and the part of the fourth side surface portion SS4 is extending from the fourth side of the front surface portion FS. Each of the corner portions of the first display area DA1 may be rounded (e.g., rounded with a predetermined curvature).

Each of the second display areas DA2 may be a second auxiliary display area that assists the first display area DA1 (e.g., the main display area, according to some embodiments). The resolution of each of the second display areas DA2 may be different from the resolution of the first display area DA1. For example, because each of the second display areas DA2 serves to assist the first display area DA1, the resolution of the second display areas DA2 may be lower than that of the first display area DA1. That is to say, the number of second pixels PX2 (see FIG. 8) per unit area in the second display areas DA2 may be less than the number of first pixels PX1 (see FIG. 6) per unit area in the first display area DA1. In addition, the size of each of the second pixels PX2 (see FIG. 8) in the second display areas DA2 may be larger than the size of each of the first pixels PX1 (see FIG. 6) in the first display area DA1. It is, however, to be understood that the present disclosure is not limited thereto. The resolution of the second display areas DA2 may be substantially equal to the resolution of the first display area DA1.

Each of the second display areas DA2 may be located on the outer side of the respective one of the corner portions of the first display area DA1. At least a part of each of the second display areas DA2 may be located at the respective one of the corner portions CS1 to CS4. In addition, in some embodiments, at least a part of each of the second display areas DA2 may be located at two of the first to fourth side surface portions SS1 to SS4.

For example, at least a part of the second display area DA2 located on the outer side of the corner portion where the lower side and the left side of the first display area DA1 meet may be located at the first corner portion CS1, the first side surface portion SS1, and the second side surface portion SS2. At least a part of the second display area DA2 located on the outer side of the corner portion where the lower side and the right side of the first display area DA1 meet may be located at the second corner portion CS, the second side surface portion SS2, and the third side surface portion SS3. At least a part of the second display area DA2 located on the outer side of the corner portion where the upper side and the right side of the first display area DA1 meet may be located at the third corner portion CS3, the third side surface portion SS3, and the fourth side surface portion SS4. At least a part of the second display area DA2 located on the outer side of the corner portion where the upper side and the left side of the first display area DA1 meet may be located at the fourth corner portion CS4, the first side surface portion SS1, and the fourth side surface portion SS4.

Each of the third display areas DA3 may be a second auxiliary display area that assists the first display area DA1 (e.g., the main display area). The resolution of each of the third display areas DA3 may be different from the resolution of the first display area DA1. For example, because the third display areas DA3 serve to assist the first display area DA1, the resolution of the third display areas DA3 may be lower than that of the first display area DA1. That is to say, the number of third pixels PX3 (see FIG. 15) per unit area in the third display areas DA3 may be smaller than the number of the first pixels PX1 (see FIG. 6) per unit area in the first display area DA1. In addition, the size of each of the third pixels PX3 (see FIG. 15) in the third display areas DA3 may be larger than the size of each of the first pixels PX1 (see FIG. 6) in the first display area DA1. It is, however, to be understood that the present disclosure is not limited thereto. The resolution of each of the third display areas DA3 may be substantially equal to the resolution of the first display area DA1 in some embodiments.

The third second display areas DA3 may be located on the outer sides of the second display areas DA2, respectively. Accordingly, the second display areas DA2 may be located between the first display area DA1 and the third display areas DA3, respectively. At least a part of each of the third display areas DA3 may be located at the respective one of the corner portions CS1 to CS4. In addition, in some embodiments, at least a part of each of the third display areas DA3 may be located at two of the first to fourth side surface portions SS1 to SS4.

For example, at least a part of the third display area DA3 located on the outer side of the corner portion where the lower side and the left side of the first display area DA1 meet may be located at the first corner portion CS1, the first side surface portion SS1, and the second side surface portion SS2. At least a part of the third display area DA3 located on the outer side of the corner portion where the lower side and the right side of the first display area DA1 meet may be located at the second corner portion CS2, the second side surface portion SS2, and the third side surface portion SS3. At least a part of the third display area DA3 located on the outer side of the corner portion where the upper side and the right side of the first display area DA1 meet may be located at the third corner portion CS3, the third side surface portion SS3, and the fourth side surface portion SS4. At least a part of the third display area DA3 located on the outer side of the corner portion where the upper side and the left side of the first display area DA1 meet may be located at the fourth corner portion CS4, the first side surface portion SS1, and the fourth side surface portion SS4.

The non-display area NDA may include the first side surface portion SS1, the second side surface portion SS2, the third side surface portion SS3, the fourth side surface portion SS4, the first corner portion CS1, the second corner portion CS2, the third corner portion CS3, and the fourth corner portion CS4. The non-display area NDA may be located on the outer sides of the first display area DA1 at the side surface portions SS1, SS2, SS3, and SS4. For example, the non-display area NDA may be located at the left edge of the first side surface portion SS1, the lower edge of the second side surface portion SS2, the right edge of the third side surface portion SS3, and the upper edge of the fourth side surface portion SS4.

The non-display area NDA may be located on the outer sides of the third display areas DA3 at the corner portions CS1, CS2, CS3, and CS4. For example, the non-display area NDA may be located at the edge of the corner portion where the upper side and the right side of the first corner portion CS1 meet, at the edge of the corner portion where the lower side and the right side of the second corner portion CS2 meet, at the edge of the corner portion where the upper side and the right side of the third corner portion CS3 meet, and at the edge of the corner portion where the upper side and the left side of the fourth corner portion CS4 meet.

The bending area BA may be extending from the lower side of the second side surface portion SS2. The bending area BA may be located between the second side surface portion SS2 and the pad area PA. The length or width of the bending area BA in the first direction (x-axis direction) may be smaller than the length or width of the second side surface portion SS2 in the first direction (x-axis direction). The bending area BA may be bent along a fifth bending line BL5 on the lower side of the second side surface portion SS2.

The pad area PA may extend from the lower side of the bent area BA. The length of the pad area PA in the first direction (x-axis direction) may be larger than the length of the bending area BA in the first direction (x-axis direction). It is, however, to be understood that the present disclosure is not limited thereto. The length of the pad area PA in the first direction (x-axis direction) may be substantially equal to the length of the bending area BA in the first direction (x-axis direction). The pad area PA may be bent along a sixth bending line BL6 on the lower side of the bending area BA. The pad area PA may be located on the lower side of, or behind, the front surface portion FS.

An integrated driver circuit IDC and the pads PAD may be located on the pad area PA. The integrated driver circuit IDC may be implemented as an integrated circuit (IC). The integrated driver circuit IDC may be attached on the pad area PA by a chip on glass (COG) technique, a chip on plastic (COP) technique, or an ultrasonic bonding. Alternatively, the integrated driver circuit IDC may be located on a circuit board located on the pads PADs of the pad area PA.

The integrated driver IDC may be electrically connected to the pads PADs of the pad area PA. The integrated driver circuit IDC may receive digital video data and timing signals through the pads PADs of the pad area PA. The integrated driver circuit IDC may convert digital video data into analog data voltages and output them to the data lines of the display areas DA1, DA2, and DA3.

The circuit board may be attached on the pads PADs of the pad area PA using an anisotropic conductive film. For this reason, the pads PADs of the pad area PA may be electrically connected to the circuit board.

As shown in FIG. 3, the display areas DA1, DA2, and DA3 may be located at the front surface portion FS, the first side surface portion SS1, the second side surface portion SS2, the third side surface portion SS3, the fourth side surface portion SS4, the first corner portion CS1, the second corner portion CS2, the third corner portion CS3, and the fourth corner portion CS4. Therefore, images can be displayed not only on the front side FS, the first side surface portion SS1, the second side surface portion SS2, the third side surface portion SS3, and the fourth side surface portion SS4, but also on the first corner portion CS1, the second corner portion CS2, the third corner portion CS3, and the fourth corner portion CS4.

Figure 4:
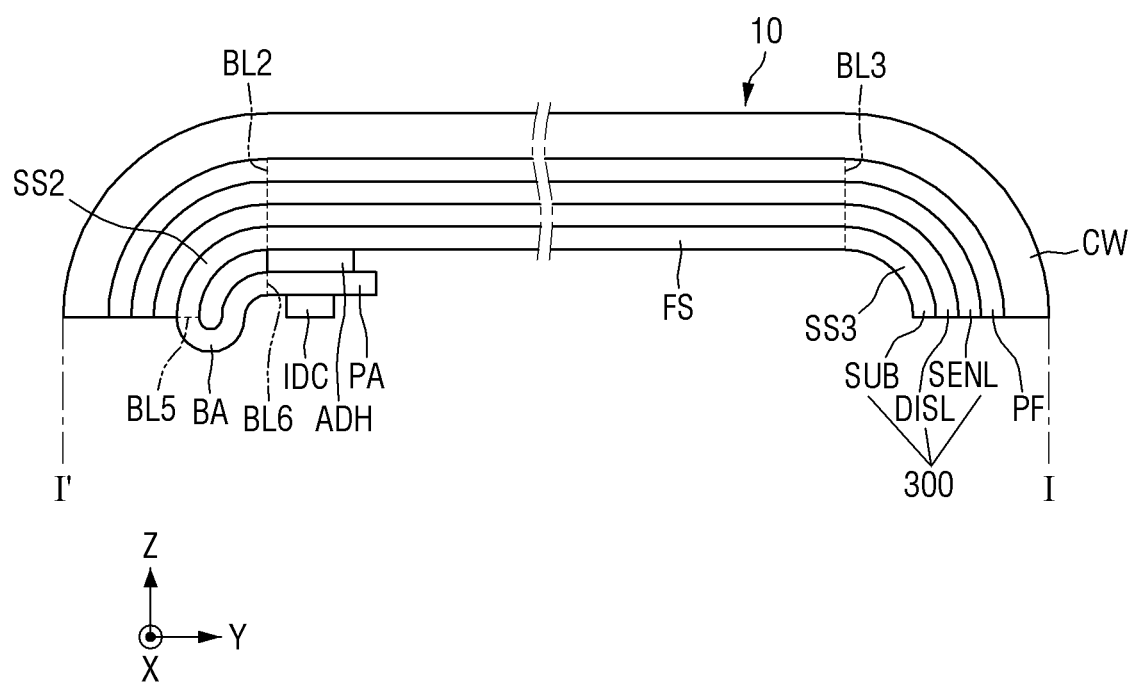
FIG. 4 is a cross-sectional view showing a display device according to some embodiments of the present disclosure.

FIG. 4 is a cross-sectional view showing a display device according to some embodiments of the present disclosure. FIG. 4 shows the display device 10, taken along the line I-I' of FIG. 2 according to some embodiments.

Referring to FIG. 4, the display device 10 may further include a cover window CW and a polarizing film PF, as well as the display panel 300. The display panel 300 may include the substrate SUB, a display layer DISL, and a sensor electrode layer SENL. The polarizing film PF may be located on the display panel 300, and the cover window CW may be located on the polarizing film PF.

The display layer DISL may be located on the substrate SUB. The display layer DISL may include the display areas DA1, DA2, and DA3 (see FIG. 3) and the non-display area NDA. Scan lines, data lines, power lines, etc. for driving light-emitting elements may be located in the display area DA of the display layer DISL in addition to the emission areas. In the non-display area NDA of the display layer DISL, a scan driver circuit for outputting scan signals to the scan lines, fan-out lines for connecting the data lines with the integrated driver circuit IDC, etc. may be located.

Figure 7:
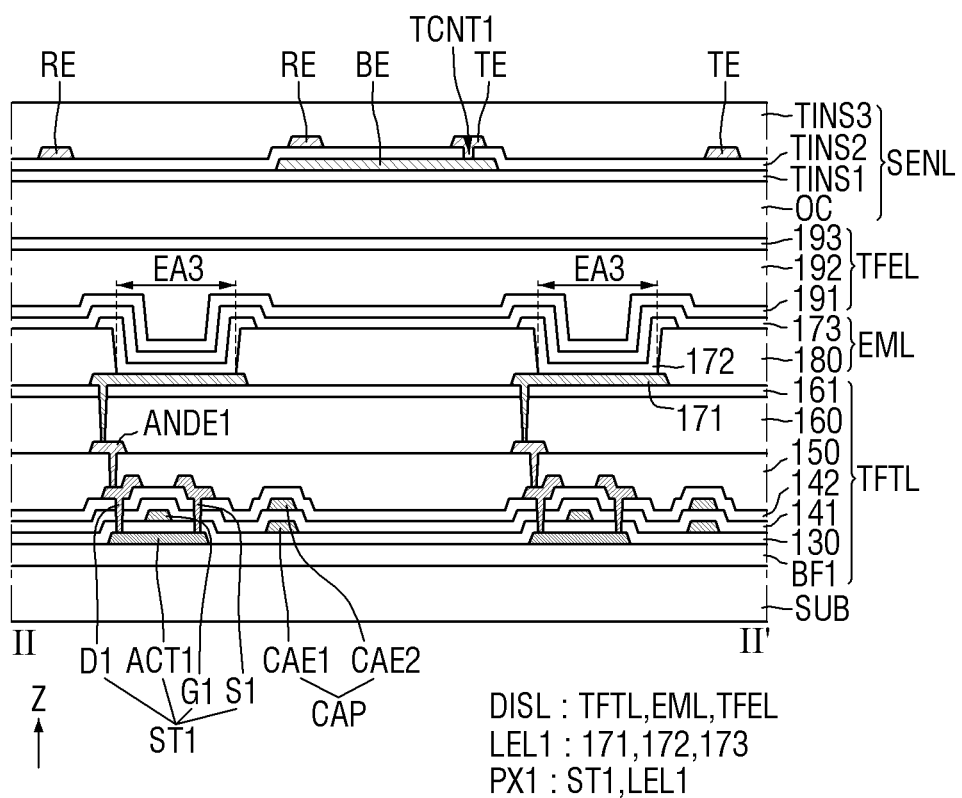
FIG. 7 is a cross-sectional view showing a display panel taken along the line II-II' of FIG. 6 according to some embodiments.

The display layer DISL may include a thin-film transistor layer TFTL in which thin-film transistors are formed, an emission material layer EML in which light-emitting elements emitting light are located in the emission areas, and an encapsulation layer TFEL for encapsulating the emission material layer, as shown in FIG. 7.

The sensor electrode layer SENL may be located on the display layer DISL. The sensor electrode layer SENL may include sensor electrodes. The sensor electrode layer SENL may sense whether there is a touch of a person or an object using the sensor electrodes.

The polarizing film PF may be located on the sensor electrode layer SENL. The polarizing film PF may include a first base member, a linear polarizer, a retardation film including a $\lambda/4$ (quarter-wave) plate and/or a $\lambda/2$ (half-wave) plate, and a second base member. For example, the first base member, the linear polarizer, the $\lambda/4$ plate, the $\lambda/2$ plate, and the second base member may be sequentially stacked on the sensor electrode layer SENL.

The cover window CW may be located on the polarizing film PF. The cover window CW may be attached on the polarizing film PF by a transparent adhesive member such as an optically clear adhesive (OCA) film and an optically clear resin (OCR). The cover window CW may be either an inorganic material, such as glass, or an organic material, such as plastic and/or polymer material.

The bending area BA may be bent along the fifth bending line BL5 and may be located on the lower surface of the second side surface portion SS2. The pad area PA may be bent along the sixth bending line BL6 and located on the lower surface of the front surface portion FS. The pad area PA may be attached to the lower surface of the front surface portion FS by an adhesive member ADH. The adhesive member ADH may be a pressure sensitive adhesive.

FIG. 5 is a layout diagram showing the first to third display areas and the non-display area located at the first corner portion of the display panel according to some embodiments of the present disclosure. FIG. 5 is an enlarged view of area A of FIG. 3.

Referring to FIG. 5, a cross point CRP of the first bending line BL1 and the second bending line BL2 may be located in the first display area DA1. In such case, the first display area DA1 may be located on the front surface portion FS, the first side surface portion SS1, the second side surface portion SS2, and the first corner portion CS1. The second display area DA2 may be located on the first side surface portion SS1, the second side surface portion SS2, and the first corner portion CS1. The third display area DA3 may be located on the first side surface portion SS1, the second side surface portion SS2, and the first corner portion CS1. The non-display area NDA may be located on the first side surface portion SS1, the second side surface portion SS2, and the first corner portion CS1.

The position of the cross point CRP of the first bending line BL1 and the second bending line BL2 is not limited to that shown in FIG. 5, but may be located in the second display area DA2 or the third display area DA3 in other embodiments.

Figure 6:
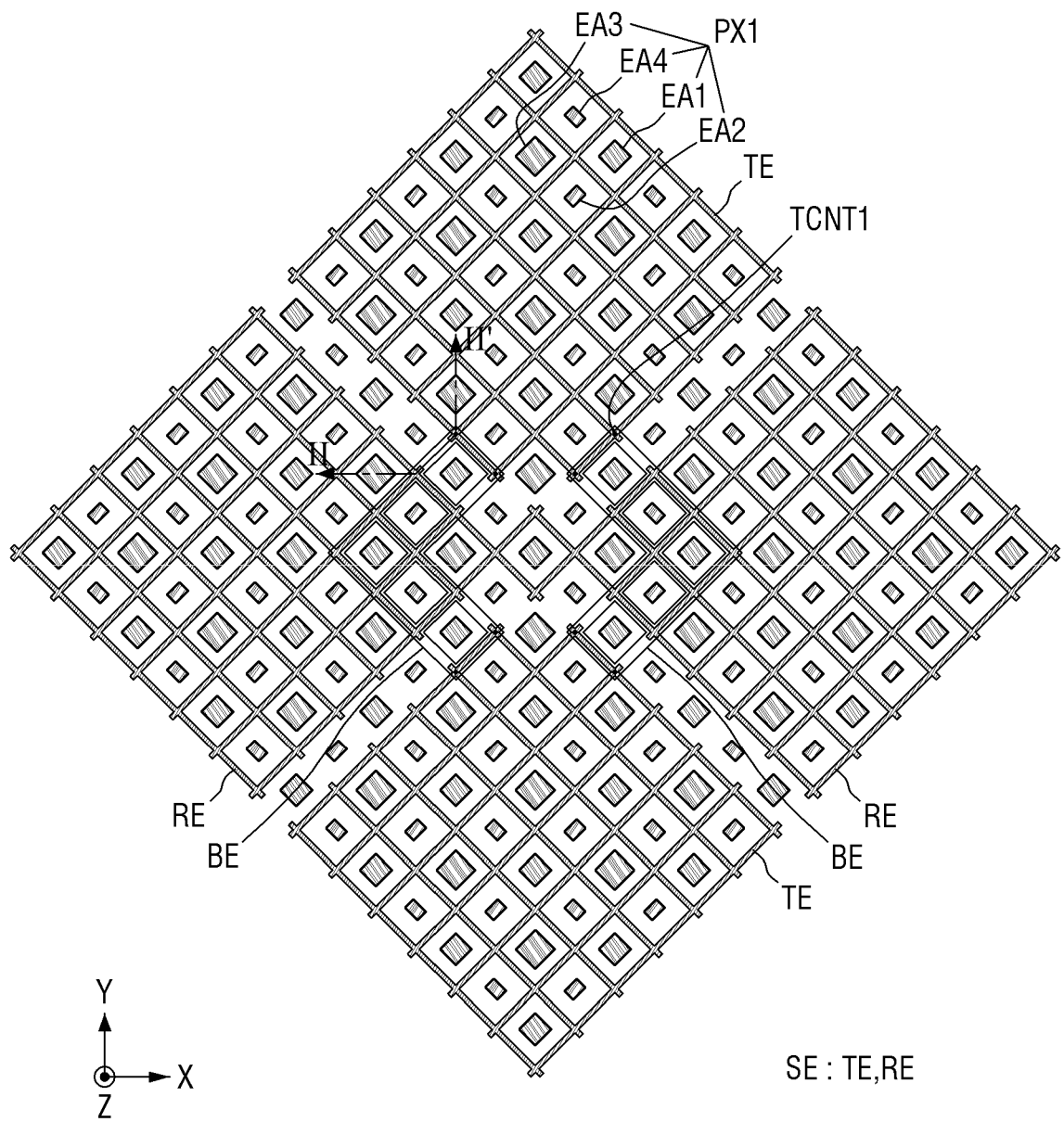
FIG. 6 is a layout diagram showing the first display area of FIG. 5 according to some embodiments.

The first display area DA1 may include the first pixels PX1 that display images (see FIG. 6). In addition, the first display area DA1 may include sensor electrodes SE for sensing a user's touch (see FIG. 6). The sensor electrodes SE may include driving electrodes TE and sensing electrodes RE (see FIG. 6).

The second display area DA2 may be located on the outer side of the first display area DA1. The second display area DA2 may include second pixels PX2 that display images (see FIG. 8).

If a non-display area is formed instead of the second display area DA2, a user may recognize the non-display area between the first display area DA1 and the third display area DA3. In other words, the user may recognize a gap between the image displayed by the first display area DA1 and the image displayed by the third display area DA3. In contrast, when the second display area DA2 including the second pixels PX2 (see FIG. 8) is formed between the first display area DA1 and the third display area DA3, it is possible to reduce or prevent visibility of a gap between the image displayed by the first display area DA1 and the image displayed by the third display area DA3 (e.g., as would otherwise be seen by a user).

The third display area DA3 may be located on the outer side of the second display area DA2. The non-display area NDA may be located on the outer side of the third display area DA3. The third display area DA3 may include third pixels PX3 that display an image (see FIG. 15).

The third display area DA3 may include cut patterns CP and cutting grooves CG. The third pixels PX3 (see FIG. 15) may be located on the cut patterns CP. The cut patterns CP may be formed by cutting the substrate SUB (see FIG. 4) of the display panel 300 with a laser. The cut patterns CP adjacent to each other may be spaced apart from each other by the cutting grooves CG. Space may be formed between the cut patterns CP adjacent to each other by the cutting grooves CG. Accordingly, even if the first corner portion CS1 has a double curvature, the first corner portion CS1 can stretch and contract, so that strain applied to the first corner portion CS1 can be reduced by virtue of the cutting grooves CG.

One end of each of the cut patterns CP may be connected to the second display area DA2, and the other end thereof may be connected to the non-display area NDA. The width of each of the cut patterns CP may decrease from the second display area DA2 toward the non-display area NDA. The width of the cut patterns CP in contact with the second display area DA2 may be larger than the width of the cut patterns in contact with the non-display area NDA.

The curvature of the outer part of the third display area may be greater than the curvature of the inner part of the third display area. For example, the third display area DA3 may have a crescent shape when viewed from the top. For this reason, the cut patterns CP may have different areas at the first corner portion CS1. In addition, the cut patterns CP have different lengths at the first corner portion CS1. The length of each of the cut patterns CP at the first corner portion CS1 may refer to the shortest distance between the position where the cut pattern CP comes in contact with the second display area DA2 and the position where the cut pattern CP comes in contact with the non-display area NDA.

A plurality of cut patterns CP may be located at the first corner portion CS1, and one cut pattern CP may be located at each of the first side surface portion SS1 and the second side surface portion SS2. The area of the cut pattern CP of each of the first side surface portion SS1 and the second side surface portion SS2 may be larger than the area of one of the cut patterns CP of the first corner portion CS1.

A voltage supply line VSL may be located in the second display area DA2 and the non-display area NDA as shown in FIG. 5. For example, the voltage supply line VSL may be located in the second display areas DA2 of the first corner portion CS1, the first side surface portion SS1, and the second side surface portion SS2. In addition, the voltage supply line VSL may be located in the non-display areas NDA of the first side surface portion SS1 and the second side surface portion SS2. The voltage supply line VSL may be located at the boundary between the second display area DA2 and the non-display areas NDA at the first side surface portion SS1 and the second side surface portion SS2.

While no pixel is located in the non-display area NDA, the second pixels PX2 are located in the second display area DA2. Therefore, it may be suitable to locate the voltage supply line VSL in the second display area DA2 so that it avoids the second pixels PX2. Accordingly, the shape of the voltage supply line VSL in the non-display area NDA is different from the shape of the voltage supply line VSL in the second display area DA2, which will be described with reference to FIGS. 8 and 13.

The scan driver connected to the scan lines of the first display area DA1 to apply scan signals may be located in the second display area DA2 and the non-display area NDA. The scan driver may overlap the voltage supply line VSL in the third direction (z-axis direction). In such case, the voltage supply line VSL may be located on the scan driving transistors SDT (see FIG. 11) of the scan driver.

The display areas DA1, DA2, and DA3 and the non-display area NDA located at the second corner portion CS2, the third corner portion CS3, and the fourth corner portion CS4 shown in FIG. 3 may be similar to the description of the first corner portion CS1 described above with respect to FIG. 5. Therefore, to avoid repeated description, the second corner portion CS2, the third corner portion CS3, and the fourth corner portion CS4 will not be described.

FIG. 6 is a layout diagram showing the first display area of FIG. 5 according to some embodiments.

FIG. 6 shows the first pixels PX1 of the first display area DA1, and the driving electrodes TE and the sensing electrodes RE of the sensor electrode layer SENL (see FIG. 4). In FIG. 6, a user's touch may be sensed by mutual capacitive sensing by using two kinds of sensor electrodes (e.g., driving electrodes TE and sensing electrodes RE). For convenience of illustration, FIG. 6 shows only two sensing electrodes RE adjacent to each other in the first direction (x-axis direction) and two driving electrodes TE adjacent to each other in the second direction (y-axis direction).

Referring to FIG. 6, the driving electrodes TE may be electrically separated from the sensing electrodes RE. The driving electrodes TE and the sensing electrodes RE are formed at the same layer, and thus they may be spaced apart from each other. There may be a gap between the driving electrodes TE and the sensing electrodes RE.

The sensing electrodes RE may be electrically connected to one another in the first direction (x-axis direction). The driving electrodes TE may be electrically connected to one another in the second direction (y-axis direction). To electrically separate the sensing electrodes RE from the driving electrodes TE at their intersections (at their crossing regions), the driving electrodes TE adjacent to one another in the second direction (y-axis direction) may be connected through connection electrodes BE.

The connection electrodes BE may be formed on a different layer from the driving electrodes TE and the sensing electrodes RE, and may be connected to the driving electrodes TE through first touch contact holes TCNT1. One end of each of the connection electrodes BE may be connected to a respective one of driving electrodes TE that are adjacent to each other in the second direction (Y-axis direction) through a corresponding first touch contact hole TCNT1. The other end of each of the connection electrodes BE may be connected to another respective one of the driving electrodes TE adjacent to each other in the second direction (Y-axis direction) through another corresponding first touch contact hole TCNT1. The connection electrodes BE may overlap the sensing electrodes RE in the third direction (Z-axis direction). Because the connection electrodes BE are formed on a different layer from the driving electrodes TE and the sensing electrodes RE, they can be electrically separated from the sensing electrodes RE even though they overlap the sensing electrodes RE in the third direction (Z-axis direction).

Each of the connection electrodes BE may be bent at least once. Although the connection electrodes BE are bent in the shape of angle brackets "<" or ">" in FIG. 6, the shape of the connection electrodes BE is not limited thereto. In addition, because the driving electrodes TE adjacent to each other in the second direction (Y-axis direction) are connected by multiple connection electrodes BE, even if any one of the connection electrodes BE is disconnected, the driving electrodes TE can still be electrically connected with each other.

Each of the driving electrodes TE and the sensing electrodes RE may have a mesh structure when viewed from the top. Because the driving electrodes TE and the sensing electrodes RE are formed on the thin-film encapsulation layer TFEL (see FIG. 7), the distance from a common electrode 173 (see FIG. 7) to the driving electrodes TE or the sensing electrodes RE is small. Therefore, parasitic capacitance may be formed between the common electrode 173 (see FIG. 7) and the driving electrodes TE or the sensing electrodes RE. The parasitic capacitance may be proportional to the area where the common electrode 173 (see FIG. 7) and the driving electrodes TE or the sensing electrodes RE overlap each other. To reduce such parasitic capacitance, it may be suitable that the driving electrodes TE and the sensing electrodes RE have a mesh structure when viewed from the top.

The first display area DA1 may include the first pixels PX1 for displaying images. Each of the first pixels PX1 may include a plurality of emission areas EA1, EA2, EA3 and EA4. For example, each of the first pixels PX1 may include a first emission area EA1, a second emission area EA2, a third emission area EA3, and a fourth emission area EA4. The first emission area EA1 refers to an emission area of a first sub-pixel that emits a first light, and the second emission area EA2 refers to an emission area of a second sub-pixel that emits a second light. The third emission area EA3 refers to an emission area of a third sub-pixel that emits a third light, and the fourth emission area EA4 refers to an emission area of a fourth sub-pixel that emits a fourth light.

The first emission area EA1, the second emission area EA2, the third emission area EA3 and the fourth emission area EA4 may emit lights of different colors. Alternatively, two of the first emission area EA1, the second emission area EA2, the third emission area EA3 and the fourth emission area EA4 may emit light of the same color. For example, the first emission area EA1 may emit light of red color, the second emission area EA2 and the fourth emission area EA4 may emit light of green color, and the third emission area EA3 may emit light of blue color.

Each of the first emission area EA1, the second emission area EA2, the third emission area EA3, and the fourth emission area EA4 may have, but is not limited to, a quadrangular shape such as a diamond when viewed from the top. For example, the first emission area EA1, the second emission area EA2, the third emission area EA3, and the fourth emission area EA4 may have other polygonal shape than a quadrangular shape, a circular shape, or an elliptical shape when viewed from the top. In FIG. 6, the third emission area EA3 has the largest area, the first emission area EA1 has the second largest area, and the second emission area EA2 and the fourth emission area EA4 have the smallest area. It is, however, to be understood that the present disclosure is not limited thereto.

Because the driving electrodes TE, the sensing electrodes RE and the connection electrodes BE are formed in a mesh structure when viewed from the top, the emission areas EA1, EA2, EA3, and EA4 might not overlap the driving electrodes TE, the sensing electrodes RE, or the connection electrodes BE in the third direction (z-axis direction). As a result, the light emitted from the emission areas EA1, EA2, EA3, and EA4 may be either not blocked or blocked to a lesser degree by the driving electrodes TE, the sensing electrodes RE, and the connection electrodes BE, and thus it may be possible to avoid or reduce a degree to which the luminance of the light is lowered by the electrodes.

FIG. 7 is a cross-sectional view showing a display panel taken along the line II-II' of FIG. 6 according to some embodiments.

Referring to FIG. 7, the display layer DISL including the thin-film transistor layer TFTL, an emission material layer EML, and an encapsulation layer TFEL may be located on the substrate SUB, and the sensor electrode layer SENL including the driving electrodes TE, the sensing electrodes RE, and the connection electrodes BE may be located on the display layer DISL. Each of the first pixels PX1 may include a first thin-film transistor ST1 and a first light-emitting element LEL1.

The substrate SUB may be made of an insulating material, such as a polymer resin and/or glass. For example, the substrate SUB may include polyimide. In such case, the substrate SUB may be a flexible substrate that can be bent, folded, or rolled.

The thin-film transistor layer TFTL including first thin-film transistors ST1 may be located on the substrate SUB. The thin-film transistor layer TFTL may include a first thin-film transistor ST1, a first connection electrode ANDE1, a first buffer layer BF1, a gate insulator 130, a first interlayer dielectric layer 141, a second interlayer dielectric layer 142, a first planarization layer 150, and a second planarization layer 160.

The first buffer layer BF1 may be located on the substrate SUB. The buffer layer BF1 may be formed of a silicon nitride layer, a silicon oxynitride layer, a silicon oxide layer, a titanium oxide layer, or an aluminum oxide layer.

The first thin-film transistor ST1 may be located on the first buffer layer BF1. The first thin-film transistor ST1 may include a first active layer ACT1, a first gate electrode G1, a first source electrode S1, and a first drain electrode D1.

The first active layer ACT1 of the first thin-film transistor ST1 may be located on the first buffer layer BF1. The first active layer ACT1 may include silicon semiconductor such as polycrystalline silicon, monocrystalline silicon, low-temperature polycrystalline silicon and/or amorphous silicon. The part of the first active layer ACT1 overlapping the first gate electrode G1 in the third direction (z-axis direction) may be defined as a channel region. The other parts of the first active layer ACT1 not overlapping the first gate electrode G1 in the third direction (z-axis direction) may be defined as conductive regions. The conductive regions of the first active layer ACT1 may have conductivity by doping a silicon semiconductor with ions or impurities.

A gate insulator 130 may be located on the first active layer ACT of the first thin-film transistor ST1. The gate insulator 130 may be formed of an inorganic layer, for example, a silicon nitride layer, a silicon oxynitride layer, a silicon oxide layer, a titanium oxide layer, and/or an aluminum oxide layer.

The first gate electrode G1 of the first thin-film transistor ST1 and a first capacitor electrode CAE1 may be located on the gate insulator 130. The first gate electrode G1 of the first thin-film transistor ST1 may overlap the first active layer ACT1 in the third direction (z-axis direction). The first capacitor electrode CAE1 may overlap a second capacitor electrode CAE2 in the third direction (z-axis direction). The first gate electrode G1 and the capacitor electrode CAE1 may be made up of a single layer or multiple layers of one of molybdenum (Mo), aluminum (Al), chromium (Cr), gold (Au), titanium (Ti), nickel (Ni), neodymium (Nd) and/or copper (Cu) and/or an alloy thereof.

The first interlayer dielectric layer 141 may be located on the first gate electrode G1 and the first capacitor electrode CAE1. The first interlayer dielectric layer 141 may be formed of an inorganic layer, for example, a silicon nitride layer, a silicon oxynitride layer, a silicon oxide layer, a titanium oxide layer, or an aluminum oxide layer. The first interlayer dielectric layer 141 may include a number of inorganic layers.

The second capacitor electrode CAE2 may be located on the first interlayer dielectric layer 141. The second capacitor electrode CAE2 may overlap the first capacitor electrode CAE1 in the third direction (z-axis direction). Because the first interlayer dielectric layer 141 has a dielectric constant (e.g., a predetermined dielectric constant), a capacitor can be formed by the first capacitor electrode CAE1, the second capacitor electrode CAE2, and the first interlayer dielectric layer 141. The second capacitor electrode CAE2 may be made up of a single layer or multiple layers of one of molybdenum (Mo), aluminum (Al), chromium (Cr), gold (Au), titanium (Ti), nickel (Ni), neodymium (Nd) and/or copper (Cu) and/or an alloy thereof.

A second interlayer dielectric layer 142 may be located over the second capacitor electrode CAE2. The second interlayer dielectric layer 142 may be formed of an inorganic layer, for example, a silicon nitride layer, a silicon oxynitride layer, a silicon oxide layer, a titanium oxide layer, and/or an aluminum oxide layer.

The first source electrode S1 and the first drain electrode D1 of the first thin-film transistor ST1 may be located on the second interlayer dielectric layer 142. The first source electrode S1 and the first drain electrode D1 may be made up of a single layer of one of molybdenum (Mo), aluminum (Al), chromium (Cr), gold (Au), titanium (Ti), nickel (Ni), neodymium (Nd) and/or copper (Cu) and/or an alloy thereof, or multiple layers thereof.

The first source electrode S1 of the first thin-film transistor ST1 may be connected to the conductive region located on a side of the change region of the first active layer ACT1 through a contact hole penetrating through the gate insulator 130, the first interlayer dielectric layer 141, and the second interlayer dielectric layer 142. The first drain electrode D1 of the first thin-film transistor ST1 may be connected to the conductive region located on the opposite side of the change region of the first active layer ACT1 through a contact hole penetrating through the gate insulator 130, the first interlayer dielectric layer 141, and the second interlayer dielectric layer 142.

The first planarization layer 150 may be located on the first source electrode S1 and the first drain electrode D1 to provide a flat surface over the thin-film transistors having different levels. The first planarization layer 150 may be formed of an organic layer such as an acryl resin, an epoxy resin, a phenolic resin, a polyamide resin and/or a polyimide resin.

The first connection electrode ANDE1 may be located on the first planarization layer 150. The first connection electrode ANDE1 may be connected to the first source electrode S1 or the first drain electrode D1 of the first thin-film transistor ST1 through a contact hole penetrating the first planarization layer 150. The first connection electrode ANDE1 may be made up of a single layer or multiple layers of one of molybdenum (Mo), aluminum (Al), chromium (Cr), gold (Au), titanium (Ti), nickel (Ni), neodymium (Nd) and/or copper (Cu) and/or an alloy thereof.

The second planarization layer 160 may be located on the first connection electrode ANDE1. The second planarization layer 160 may be formed of an organic layer such as an acryl resin, an epoxy resin, a phenolic resin, a polyamide resin, and/or a polyimide resin.

A barrier layer 161 may be located on the second planarization layer 160. The barrier layer 161 may be formed of an inorganic layer, for example, a silicon nitride layer, a silicon oxynitride layer, a silicon oxide layer, a titanium oxide layer, or an aluminum oxide layer.

The emission material layer EML may be located on the thin-film transistor layer TFTL. The emission material layer EML may include first light-emitting elements LEL1 and a bank 180.

Each of the first light-emitting elements LEL1 may include a pixel electrode 171, a light emitting layer 172, and a common electrode 173. In each of the emission areas EA1, EA2, EA3, and EA4, the pixel electrode 171, the light emitting layer 172, and the common electrode 173 are stacked on one another sequentially, so that holes from the pixel electrode 171 and electrons from the common electrode 173 are combined with each other in the light emitting layer 172 to emit light. In such case, the pixel electrode 171 may be an anode electrode while the common electrode 173 may be a cathode electrode. The first emission area EA1, the second emission area EA2, and the fourth emission area EA4 may be substantially similar or identical to the third emission area EA3 shown in FIG. 7.

The pixel electrode 171 may be located on the barrier layer 161. The pixel electrode 171 may be connected to the first connection electrode ANDE1 through a contact hole penetrating the barrier layer 161 and the second planarization layer 160.

In the top-emission structure, where light exits from the light emitting layer 172 toward the common electrode 173, the pixel electrode 171 may be made up of a single layer of molybdenum (Mo), titanium (Ti), copper (Cu) and/or aluminum (Al), or may be made up of a stack structure of aluminum and titanium (Ti/Al/Ti), a stack structure of aluminum and ITO (ITO/Al/ITO), an APC alloy, and/or a stack structure of APC alloy and ITO (ITO/APC/ITO) to increase the reflectivity. The APC alloy is an alloy of silver (Ag), palladium (Pd) and copper (Cu).

The bank 180 serves to define each of the emission areas EA1, EA2, EA3 and EA4 of display pixels. To this end, the bank 180 may be formed on the barrier layer 161 to expose a part of the pixel electrode 171. The bank 180 may cover the edge of the pixel electrode 171. In some embodiments, the bank 180 may be located in a contact hole penetrating through the barrier layer 161 and the second planarization layer 160. Accordingly, the contact hole penetrating the barrier layer 161 and the second planarization layer 160 may be filled with the bank 180. The bank 180 may be formed of an organic layer such as an acryl resin, an epoxy resin, a phenolic resin, a polyamide resin and/or a polyimide resin.

The light emitting layer 172 is located on the pixel electrode 171. The light emitting layer 172 may include an organic material, and may emit light of a certain color. For example, the light emitting layer 172 may include a hole transporting layer, an organic material layer, and an electron transporting layer. The organic material layer may include a host and a dopant. The organic material layer may include a material that emits light (e.g., a predetermined light), and may be formed using a phosphor or a fluorescent material.

The common electrode 173 is located on the light emitting layer 172. The common electrode 173 may cover the light emitting layer 172. The common electrode 173 may be a common layer formed across the display pixels. A capping layer may be formed on the common electrode 173.

In the top-emission structure, the common electrode 173 may be formed of a transparent conductive material (TCP) such as ITO and IZO that can transmit light, or a semi-transmissive conductive material such as magnesium (Mg), silver (Ag) and an alloy of magnesium (Mg) and silver (Ag). When the common electrode 173 is formed of a semi-transmissive metal material, the light extraction efficiency may be increased by using microcavities.

The encapsulation layer TFEL may be formed on the emission material layer EML. The encapsulation layer TFEL may include at least one inorganic layer to reduce or prevent permeation of oxygen or moisture into the emission material layer EML. In addition, the encapsulation layer TFEL may include at least one organic layer to protect the emission material layer EML from particles.

For example, the thin-film encapsulation layer TFEL may include a first inorganic encapsulation layer 191 located on the common electrode 173, an organic encapsulation layer 192 located on the first inorganic encapsulation layer 191, and a second inorganic encapsulation layer 193 located on the organic encapsulation layer 192. The first inorganic encapsulation layer 191 and the second inorganic encapsulation layer 193 may be made up of multiple layers in which one or more inorganic layers of a silicon nitride layer, a silicon oxynitride layer, a silicon oxide layer, a titanium oxide layer, and/or an aluminum oxide layer are alternately stacked on one another. The organic layer may be an acryl resin, an epoxy resin, a phenolic resin, a polyamide resin, and/or a polyimide resin.

The sensor electrode layer SENL is located on the thin-film encapsulation layer TFEL. The sensor electrode layer SENL may include the driving electrodes TE, the sensing electrodes RE, and the connection electrodes BE.

An overcoat layer OC may be located on the thin-film encapsulation layer TFEL. The overcoat layer OC may include at least one inorganic layer. For example, the overcoat layer OC may be formed of an organic layer such as an acryl resin, an epoxy resin, a phenolic resin, a polyamide resin, and/or a polyimide resin.

A first touch inorganic layer TINS1 may be located on the overcoat layer OC. The first touch inorganic layer TINS1 may be formed as a silicon nitride layer, a silicon oxynitride layer, a silicon oxide layer, a titanium oxide layer, or an aluminum oxide layer.

The connection electrodes BE may be located on the first touch inorganic layer TINS1. The connection electrodes BE may be made up of a single layer of molybdenum (Mo), titanium (Ti), copper (Cu), or aluminum (Al), or may be made up of a stack structure of aluminum and titanium (Ti/Al/Ti), a stack structure of aluminum and ITO (ITO/Al/ITO), an APC alloy, and/or a stack structure of an APC alloy and ITO (ITO/APC/ITO).

A second touch inorganic layer TINS2 may be located on the connection electrodes BE. The second touch inorganic layer TINS2 may be formed as a silicon nitride layer, a silicon oxynitride layer, a silicon oxide layer, a titanium oxide layer, or an aluminum oxide layer.

The driving electrodes TE and the sensing electrodes RE may be located on the second touch inorganic layer TINS2. To reduce or prevent blockage of the light emitted from the emission areas EA1, EA2, EA3 and EA4 by the driving electrodes TE and the sensing electrodes RE, which would otherwise decrease the luminance of the light, the driving electrodes TE and the sensor electrodes RE do not overlap the emission areas EA1, EA2, EA3, and EA4. The driving electrodes TE and the sensing electrodes RE may be made up of a single layer of molybdenum (Mo), titanium (Ti), copper (Cu), or aluminum (Al), or may be made up of a stack structure of aluminum and titanium (Ti/Al/Ti), a stack structure of aluminum and ITO (ITO/Al/ITO), an APC alloy, or a stack structure of an APC alloy and ITO (ITO/APC/ITO).

A touch organic layer TINS3 may be located on the driving electrodes TE and the sensing electrodes RE. The touch organic layer TINS3 may be an acryl resin, an epoxy resin, a phenolic resin, a polyamide resin, and/or a polyimide resin.

Figure 8:
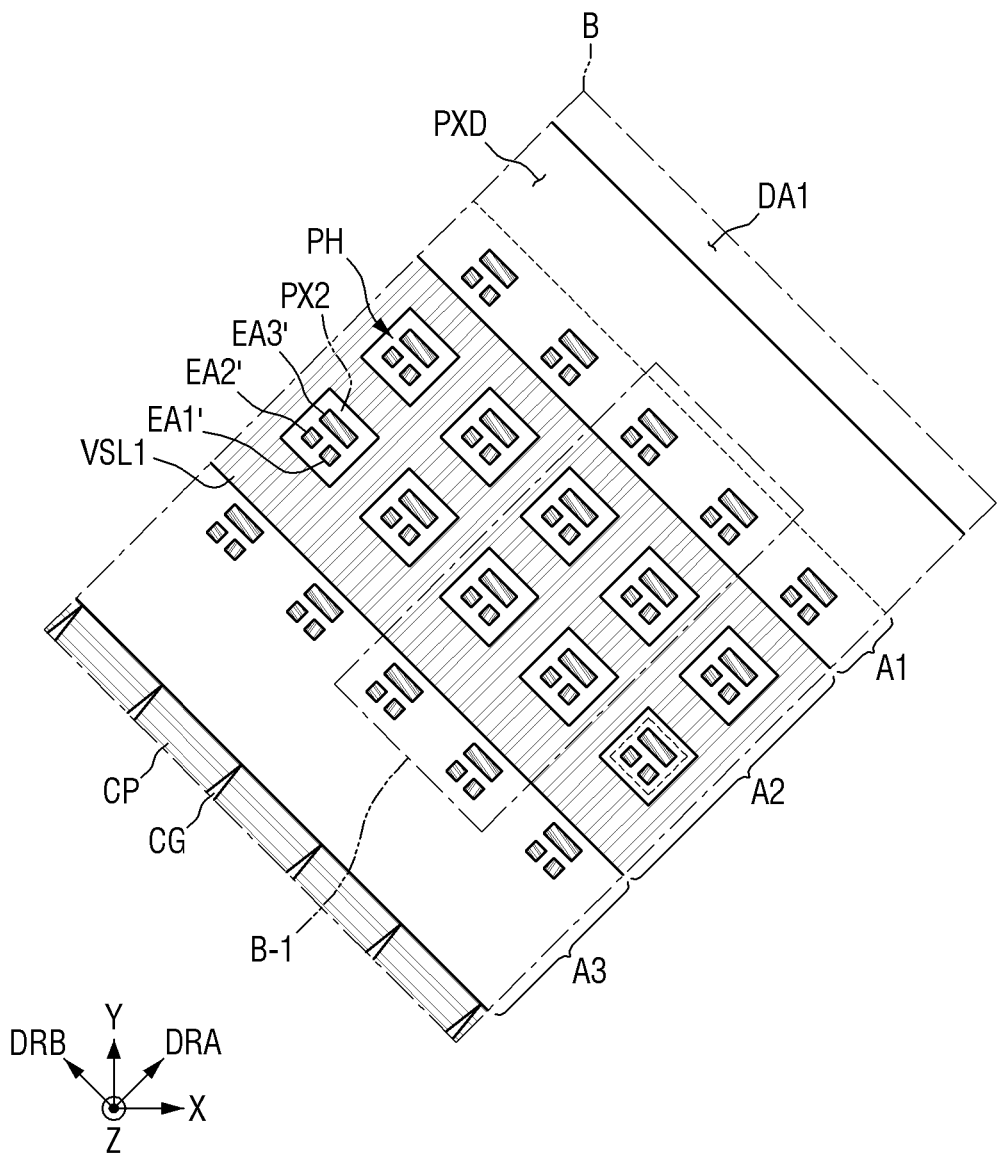
FIG. 8 is a layout diagram showing the second display area of FIG. 5 according to some embodiments.

FIG. 8 is a layout diagram showing the second display area of FIG. 5 according to some embodiments.

FIG. 8 shows a layout of area B of FIG. 5 according to some embodiments. FIG. 8 shows only a first voltage supply line VSL1 of the voltage supply line VSL (see FIG. 5), second pixels PX2, and a pixel driver PXD for convenience of illustration.

Referring to FIG. 8, the first voltage supply line VSL1 has a width in an A-direction DRA and may extend in a B-direction DRB. The A-direction DRA may be inclined by +45 degrees from the first direction (x-axis direction) and by −45 degrees from the second direction (y-axis direction). The B-direction DRB may intersect, or may be perpendicular to, the A-direction DRA. For example, the B-direction DRB may be inclined by +135 degrees from the first direction (x-axis direction) and by +45 degrees from the second direction (y-axis direction).

The first voltage supply line VSL1 may include pixel holes PH spaced apart from one another. The pixel holes PH may be arranged in the A-direction DRA and the B-direction DRB. In other words, the pixel holes PH may be arranged in a matrix pattern. The distance between the pixel holes PH adjacent to each other in the A-direction DRA may be substantially equal to the distance between the pixel holes PH adjacent to each other in the B-direction DRB. It is, however, to be understood that the present disclosure is not limited thereto.

The second pixels PX2 may be arranged in the A-direction DRA and in the B-direction DRB. The second pixels PX2 may be arranged in a matrix pattern. The second pixels PX2 might not overlap the first voltage supply line VSL1 in the third direction (z-axis direction). For example, the second display area DA2 may include a first area A1 where the second pixels PX2 are located between the first voltage supply line VSL1 and the first display area DA1, a second area A2 where the second pixels PX2 are located between the first voltage supply line VSL1 and the pixel holes PH (e.g., in or overlapping the pixel holes PH between respective portions of the first voltage supply line VSL1), and a third area A3 where the second pixels PX2 are located between the first voltage supply line VSL1 and the cut patterns CP.

Although one second pixel PX2 is located in each of the pixel holes PH of the first voltage supply line VSL1 in FIG. 8, the present disclosure is not limited thereto. More than one second pixel PX2 may be located in each of the pixel holes PH of the first voltage supply line VSL1.

The distances between the second pixels PX2 adjacent to each other in the A-direction DRA may be substantially equal, and the distances between the second pixels PX2 adjacent to each other in the B-direction DRB may be substantially equal. It is, however, to be understood that the present disclosure is not limited thereto. The distances between the second pixels PX2 adjacent to each other in the A-direction DRA may be substantially equal to the distances between the second pixels PX2 adjacent to each other in the B-direction DRB. It is, however, to be understood that the present disclosure is not limited thereto.

Each of the second pixels PX2 may include a plurality of emission areas EA1', EA2', and EA3'. The number of the emission areas EA1', EA2', and EA3' of each of the second pixels PX2 may be different from the number of the emission areas EA1, EA2, EA3, and EA4 of each of the first pixels PX1.

Each of the second pixels PX2 may include a first emission area EA1', a second emission area EA2', and a third emission area EA3'. The first emission area EA1' refers to the emission area of the first sub-pixel emitting first light, the second emission area EA2' refers to the emission area of the second sub-pixel emitting second light, and the third emission area EA3' refers to the emission area of the third sub-pixel that emits third light.

The first emission area EA1', the second emission area EA2', and the third emission area EA3' may emit lights of different colors. For example, the first emission area EA1' may emit light of red color, the second emission area EA2' may emit light of green color, and the third emission area EA3' may emit light of blue color.

The first emission area EA1' and the second emission area EA2' may be arranged in the B-direction DRB. The first emission area EA1' and the third emission area EA3' may be arranged in the A-direction DRA, and the second emission area EA2' and the third emission area EA3' may be arranged in the A-direction DRA.

The shape of each of the emission areas EA1', EA2', and EA3' of the second pixels PX2 may be different from the shape of each of the emission areas EA1, EA2, EA3, and EA4 of the first pixels PX1 when viewed from the top. For example, the first emission area EA1' and the second emission area EA2' may have a square shape having sides in the A-direction DRA and sides in the B-direction DRB which are all even when viewed from the top. Each third emission area EA3' may have a rectangular shape having short sides in the A-direction DRA and longer sides in the B-direction DRB. It is, however, to be understood that the shape of each of the first emission area EA1', the second emission area EA2', and the third emission area EA3' when viewed from the top is not limited thereto. Each of the first emission area EA1', the second emission area EA2', and the third emission area EA3' may have a polygonal shape that is other than a quadrangular shape, a circular shape, or an elliptical shape when viewed from the top.

The first emission area EA1' and the second emission area EA2' have the equal area, and the third emission area EA3' may have a different area from the area of the first emission area EA1' and the second emission area EA2'. The area of the third emission area EA3' may be larger than the area of the first emission area EA1' and the area of the second emission area EA2'.

The pixel driver PXD driving the second pixels PX2 may be located between the first voltage supply line VSL1 and the first display area DA1. The pixel driver PXD may be located between the first display area DA1 and the second pixels PX2 that are located between the first voltage supply line VSL1 and the first display area DA1.

The pixel driver PXD may include second thin-film transistors ST2 (see FIG. 11) for supplying driving current or driving voltage to the second light-emitting elements LEL2 (see FIG. 11) of the second pixels PX2. To this end, pixel connection lines PXC (see FIG. 10) may be located to connect the emission areas EA1', EA2', and EA3' of the second pixels PX2 with the second thin-film transistors ST2 (see FIG. 11) of the pixel driver PXD.

As shown in FIG. 8, the second display area DA2 including second pixels PX2 for displaying images is located between the first display area DA1 and the third display area DA3. Therefore, it is possible to reduce or prevent recognition, by a user, of a gap between the image displayed by the first display area DA1 and the image displayed by the second display area DA2.

Figure 9:
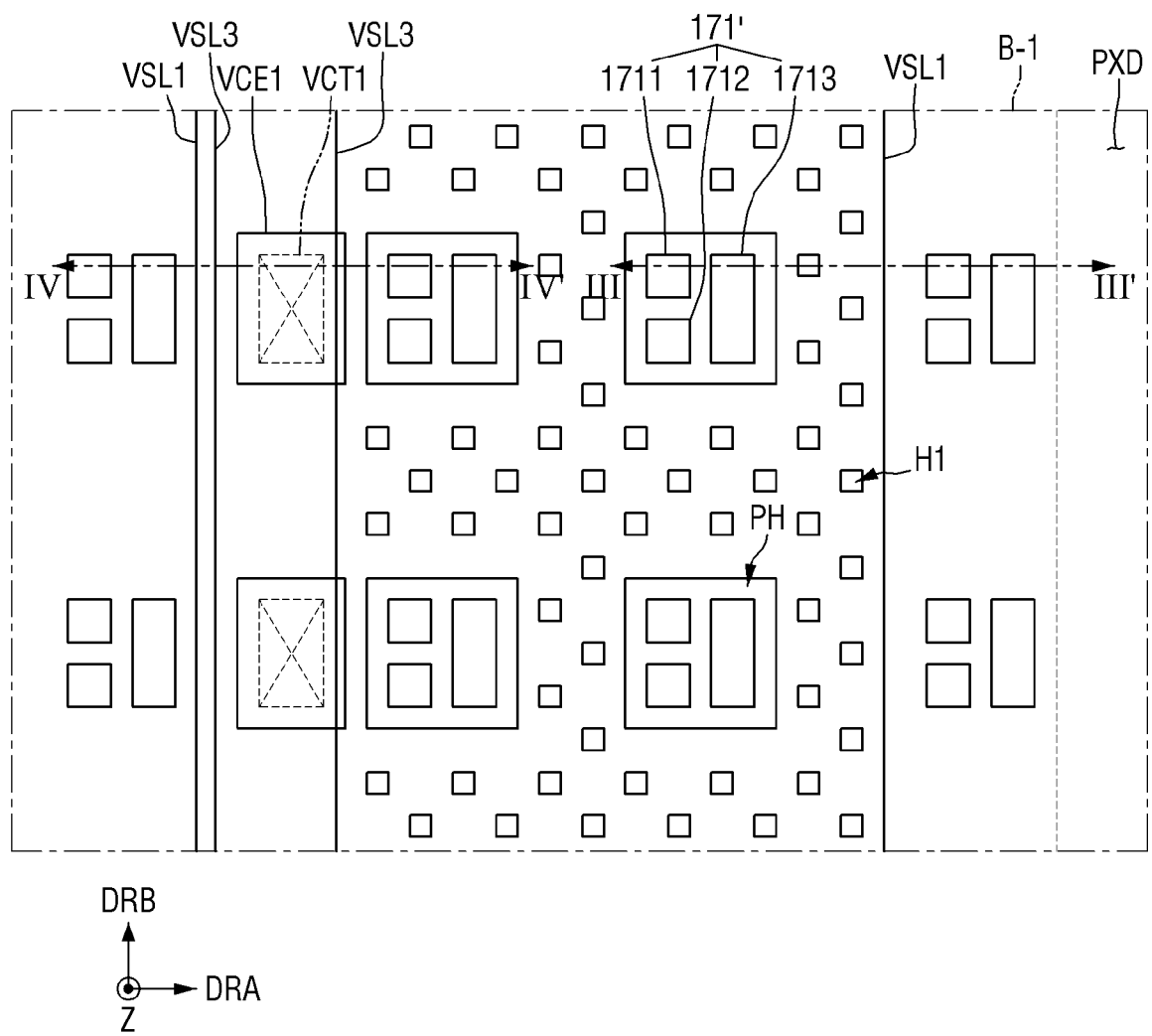
FIG. 9 is an enlarged layout diagram showing the first voltage supply line, voltage connection electrodes, voltage connection contact holes, pixel electrodes of second pixels, and first holes in area B-1 of FIG. 8 according to some embodiments.
Figure 10:
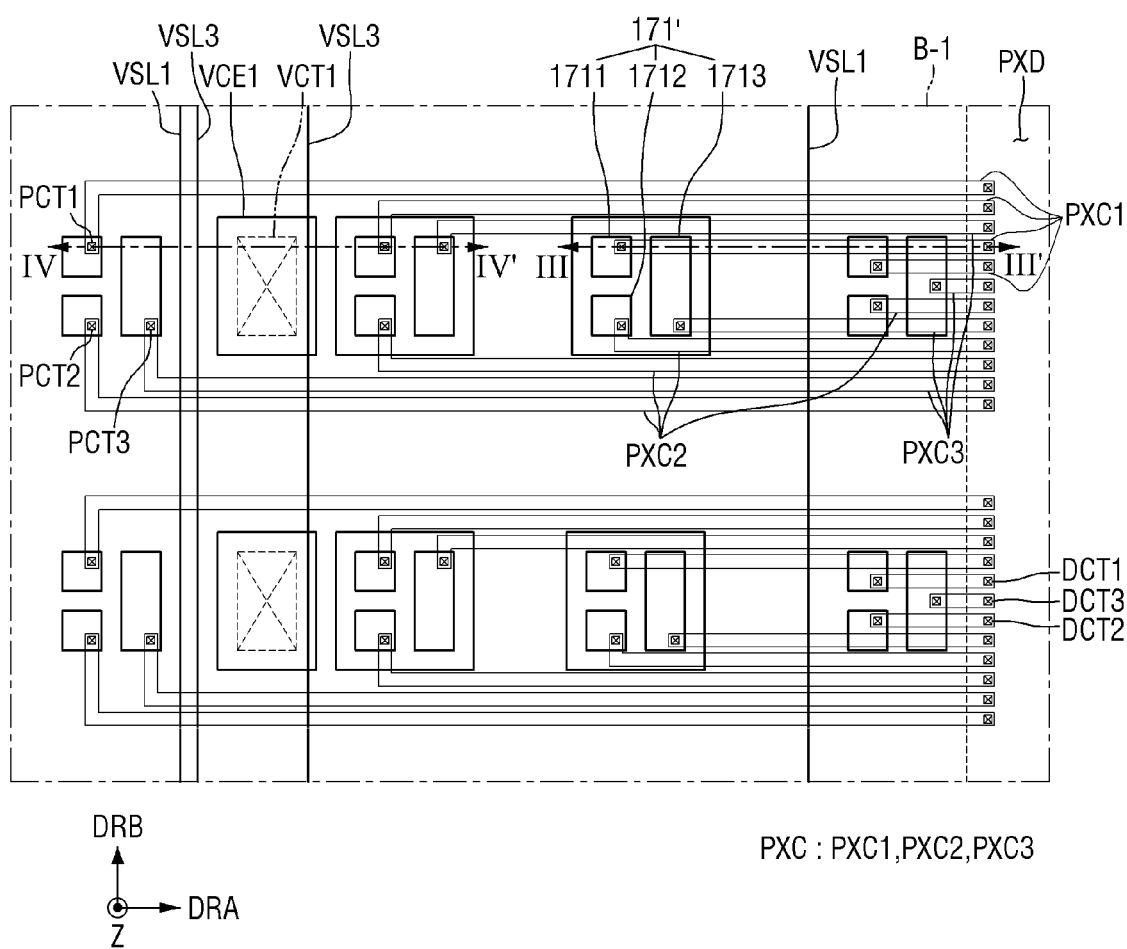
FIG. 10 is an enlarged layout diagram showing the first voltage supply line, voltage connection electrodes, voltage connection contact holes, pixel electrodes of second pixels, and pixel connection lines in area B-1 of FIG. 8 according to some embodiments.

FIG. 9 is an enlarged layout diagram showing the first voltage supply line, voltage connection electrodes, voltage connection contact holes, pixel electrodes of second pixels, and first holes in area B-1 of FIG. 8 according to some embodiments. FIG. 10 is an enlarged layout diagram showing the first voltage supply line, voltage connection electrodes, voltage connection contact holes, pixel electrodes of second pixels, and pixel connection lines in area B-1 of FIG. 8 according to some embodiments.

The first holes H1 and the pixel connection lines PXC are depicted in two different figures (FIG. 9 and FIG. 10), respectively, because it is difficult to depict the area where the first holes H1 and the pixel connection lines PXC overlap each other in a single figure.

Referring to FIGS. 9 and 10, the voltage supply line VSL in the second display area DA2 may include the first voltage supply line VSL1, first voltage connection electrodes VCE1 and a third voltage supply line VSL3.

The first voltage supply line VSL1 may include pixel holes PH and first holes H1. In the pixel holes PH, the second pixels PX2 may be located. Because the second planarization layer 160 is made of an organic layer, the first holes H1 may provide paths for outgassing for the organic layer. Because the gas of the organic layer can be discharged through the first holes H1, it is possible to reduce, prevent, or suppress damage to the light emitting layers 172 and 172' of the light-emitting elements LEL1 and LEL2 otherwise caused by the gas of the organic layer.

The pixel holes PH and the first holes H1 may be spaced apart from each other. The size of the pixel holes PH may be larger than the size of the first holes H1. The distances between the pixel holes PH adjacent to each other in the A-direction DRA may be greater than the distances between the first holes H1 adjacent to each other in the A-direction DRA. The distances between the pixel holes PH adjacent to each other in the B-direction DRB may be greater than the distances between the first holes H1 adjacent to each other in the B-direction DRB. A plurality of first holes H1 may be located between pixel holes PH that are adjacent to each other in the A-direction DRA. Also, the plurality of first holes H1 may be located between the pixel holes PH adjacent to each other in the B-direction DRB.

Each of the first voltage connection electrodes VCE1 may overlap a first voltage connection contact hole VCT1. Each of the first voltage connection electrodes VCE1 may have a rectangular shape when viewed from the top. Each of the first voltage connection electrodes VCE1 might not overlap with the second pixels PX2 in the third direction (z-axis direction). Each of the first voltage connection electrodes VCE1 may overlap with the first voltage supply line VSL1 in the third direction (z-axis direction). In addition, each of the first voltage connection electrodes VCE1 may overlap with the third voltage supply line VSL3 in the third direction (z-axis direction). The first voltage supply line VSL1, the first voltage connection electrode VCE1, and the third voltage supply line VSL3 may be connected to one another through the first voltage connection contact hole VCT1.

The width of the third voltage supply line VSL3 may be smaller than the width of the first voltage supply line VSL1. The third voltage supply line VSL3 may be located between adjacent second pixels PX2 that are adjacent in the A-direction DRA.

The pixel electrodes 171' of the second pixels PX2 may be located in the pixel holes PH. Each of the pixel electrodes 171' of the second pixels PX2 may be connected to the second thin-film transistor ST2 of the pixel driver PXD through the pixel connection line PXC.

In the following description, for convenience of illustration, the pixel electrode 171' of the first emission area EA1' (see FIG. 8) of the second pixel PX2 is defined as a first pixel electrode 1711, the pixel electrode 171' of the second emission area EA2' (see FIG. 8) is defined as a second pixel electrode 1712, and the pixel electrode 171' of the third emission area EA3' (see FIG. 8) is a third pixel electrode 1713. In such case, the light emitting layer 172' (see FIG. 11) located on the first pixel electrode 1711 may be defined as a first light emitting layer, the light emitting layer 172' (see FIG. 11) located on the second pixel electrode 1712 may be defined as a second light emitting layer, and the light emitting layer 172' (see FIG. 11) located on the third pixel electrode 1713 may be defined as a third light emitting layer.

In addition, in the following description, for convenience of illustration, the pixel connection line PXC connected to the first pixel electrode 1711 is defined as a first pixel connection line PXC1, the pixel connection line PXC connected to the second pixel electrode 1712 is defined as a second pixel connection line PXC2, and the pixel connection line PXC connected to the third pixel electrode 1713 is defined as a third pixel connection line PXC3.

One end of each of the first pixel connection lines PXC1 may be connected to the first pixel electrode 1711 through a first pixel contact hole PCT1. The other end of each of the first pixel connection lines PXC1 may be connected to the second thin-film transistor ST2 through a first driving contact hole DCT1.

Each of the first pixel connection lines PXC1 may extend in the A-direction DRA. Some of the first pixel connection lines PXC1 may be bent at least once. The others of the first pixel connection lines PXC1 may be unbent (e.g., generally or substantially unbent). For example, the first pixel connection line PXC1 connected to the first pixel electrode 1711 of the second pixel PX2 located between the first voltage supply line VSL1 and the cut patterns CP may be bent at least once. In addition, the first pixel connection line PXC1 connected to the first pixel electrode 1711 of the second pixel PX2 located in the pixel hole PH adjacent to the cut patterns CP may be bent at least once. The first pixel connection line PXC1 connected to the first pixel electrode 1711 of the second pixel PX2 located between the first voltage supply line VSL1 and the first display area DA1 may be unbent. In addition, the first pixel connection line PXC1 connected to the first pixel electrode 1711 of the second pixel PX2 located in the pixel hole PH adjacent to the pixel driver PD may be unbent.

The first pixel connection lines PXC1 may have different lengths. For example, the first pixel connection line PXC1 connected to the first pixel electrode 1711 of the second pixel PX2 located between the first voltage supply line VSL1 and the cut patterns CP may have the longest length. The first pixel connection line PXC1 connected to the first pixel electrode 1711 of the second pixel PX2 located between the first voltage supply line VSL1 and the first display area DA1 may have the shortest length.

The first pixel connection line PXC1 connected to the first pixel electrode 1711 of the second pixel PX2 may overlap the third pixel electrode 1713 of the second pixel PX2 in the third direction (z-axis direction). For example, the first pixel connection line PXC1 connected to the first pixel electrode 1711 of the second pixel PX2 located between the first voltage supply line VSL1 and the first display area DA1 may overlap the third pixel electrode 1713 of the second pixel PX2 in the third direction (z-axis direction).

In addition, the first pixel connection line PXC1 connected to the first pixel electrode 1711 of the second pixel PX2 may overlap the first pixel electrode 1711 and the third pixel electrode 1713 of another second pixel PX2 in the third direction (z-axis direction). For example, the first pixel connection line PXC1 connected to the first pixel electrode 1711 of the second pixel PX2 located in the pixel hole PH adjacent to the pixel driver PD may overlap the first pixel electrode 1711 and the third pixel electrode 1713 of the second pixel PX2 located between the first voltage supply line VSL1 and the first display area DA1 in the third direction (z-axis direction).

One end of each of the second pixel connection lines PXC2 may be connected to the second pixel electrode 1712 through a second pixel contact hole PCT2. The other end of each of the second pixel connection lines PXC2 may be connected to the second thin-film transistor ST2 through a second driving contact hole DCT2.

Each of the second pixel connection lines PXC2 may extend in the A-direction DRA. Some of the second pixel connection lines PXC2 may be bent at least once. The others of the second pixel connection lines PXC2 may be unbent. The second pixel connection lines PXC2 may have different lengths. The second pixel connection line PXC2 connected to the second pixel electrode 1712 of the second pixel PX2 may overlap the third pixel electrode 1713 of the second pixel PX2 in the third direction (z-axis direction).

One end of each of the third pixel connection lines PXC3 may be connected to the third pixel electrode 1713 through a third pixel contact hole PCT3. The other end of each of the third pixel connection lines PXC3 may be connected to the second thin-film transistor ST2 through a third driving contact hole DCT3.

Each of the third pixel connection lines PXC3 may extend in the A-direction DRA. Some of the third pixel connection lines PXC3 may be bent at least once. The others of the third pixel connection lines PXC3 may be unbent. The third pixel connection lines PXC3 may have different lengths. The third pixel connection line PXC3 connected to the third pixel electrode 1713 of the second pixel PX2 may overlap the second pixel electrode 1712 and the third pixel electrode 1713 of another second pixel PX2 in the third direction (z-axis direction).

The first voltage connection contact hole VCT1 may be located between adjacent second pixels PX2 in the A-direction DRA. The first voltage connection contact hole VCT1 may be located between the adjacent pixel connection lines PXC in the B-direction DRB.

As shown in FIGS. 9 and 10, to reduce or prevent recognition, by a user, of a gap between the images displayed by the first display area DA1 and the images displayed by the third display area DA3, the second display area DA2 may include the second pixels PX2 to display images. At this time, because each of the second pixels PX2 is located in the pixel hole PH of the first voltage supply line VSL1 in the second display area DA2, the second pixels PX2 can be located so that they avoid the first voltage supply line VSL1.

In addition, the pixel driver PXD including the second thin-film transistors ST2 (see FIG. 11) for supplying driving current or driving voltage to the second light-emitting elements LEL2 (see FIG. 11) of the second pixels PX2 may be located in display area DA2 between the first voltage supply line VSL1 and the first display area DA1. In such case, the second light-emitting elements LEL2 (see FIG. 11) of the second pixels PX2 may be connected to the second thin-film transistors ST2 (see FIG. 11) of the pixel driver PXD through the pixel connection lines PXC (see FIG. 10). Accordingly, the second thin-film transistors ST2 (see FIG. 11) may be located so that they avoid the scan driving transistors SDT (see FIG. 11) of the scan driver located in the second display area DA2.

Figure 11:
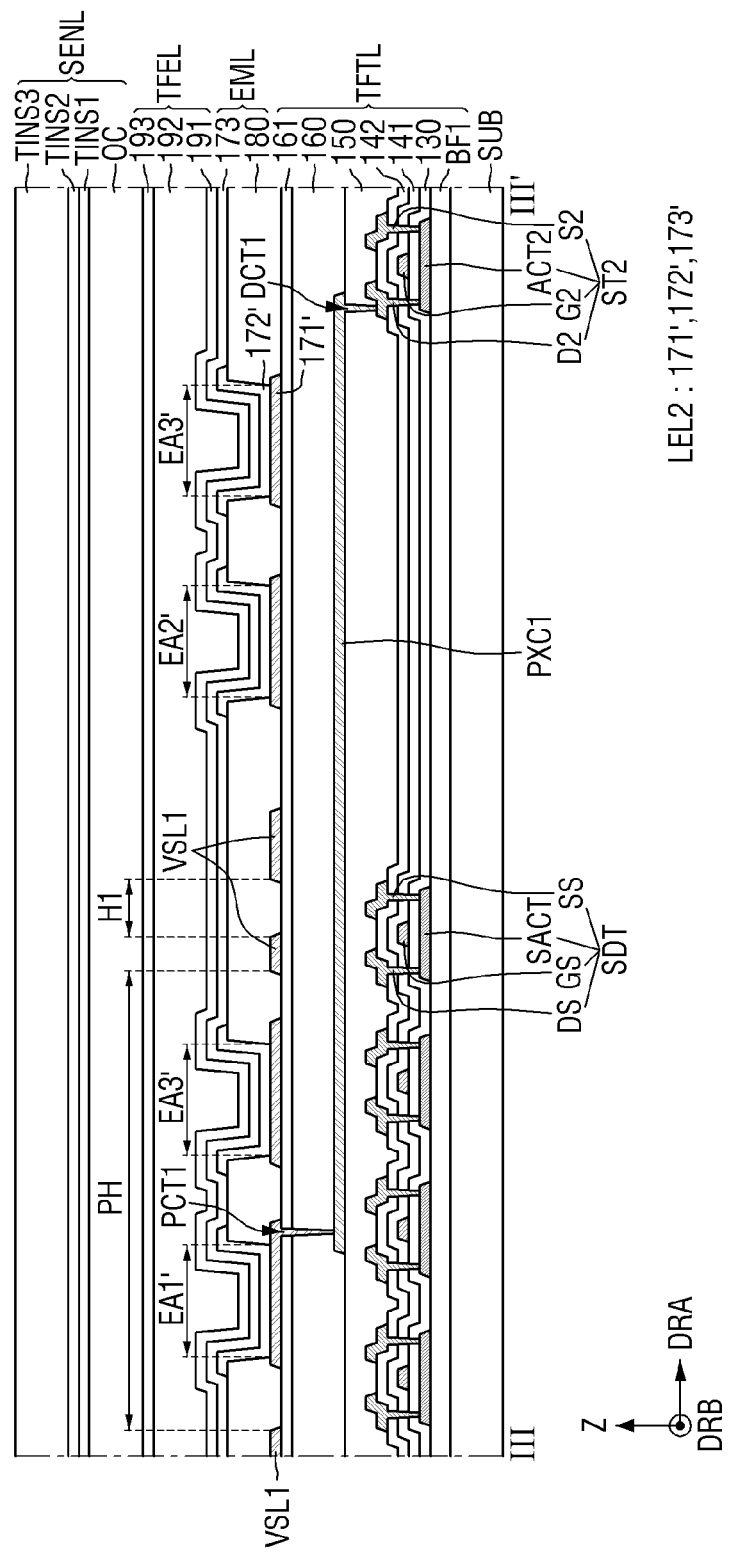
FIG. 11 is a cross-sectional view showing the display panel taken along the line III-III' of FIGS. 9 and 10 according to some embodiments.
Figure 12:
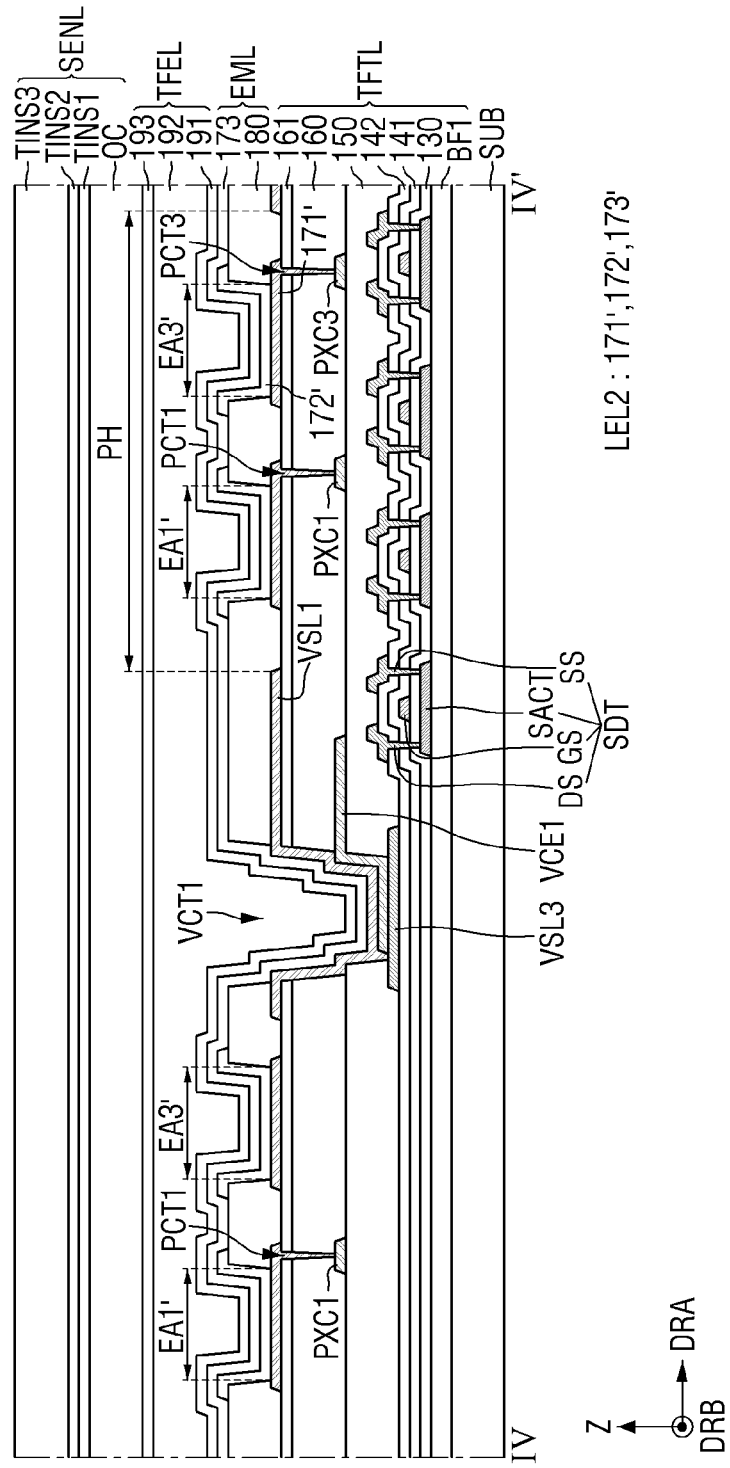
FIG. 12 is a cross-sectional view showing the display panel, taken along the line IV-IV' of FIGS. 9 and 10 according to some embodiments.

FIG. 11 is a cross-sectional view showing the display panel taken along the line III-III' of FIGS. 9 and 10 according to some embodiments. FIG. 12 is a cross-sectional view showing the display panel, taken along the line IV-IV' of FIGS. 9 and 10 according to some embodiments.

Referring to FIGS. 11 and 12, the thin-film transistor layer TFTL may include second thin-film transistors ST2 of the pixel driver PXD and scan driving transistors SDT of the scan driver.

The second thin-film transistor ST2 may include a second active electrode ACT2, a second gate electrode G2, a second source electrode S2, and a second drain electrode D2. The second active layer ACT2, the second gate electrode G2, the second source electrode S2, and the second drain electrode D2 of the second thin-film transistor ST2 may be substantially similar or identical to the first active layer ACT1, the first gate electrode G1, the first source electrode S1, and the first drain electrode D1 of the first thin-film transistor ST1 described above with reference to FIG. 7, respectively. Accordingly, repeated description of the second thin-film transistor ST2 will be omitted.

The scan driving transistor SDT may include a scan active layer SACT, a scan gate electrode GS, a scan source electrode SS and a scan drain electrode DS. The scan active layer SACT, the scan gate electrode GS, the scan source electrode SS and the scan drain electrode DS of the scan driving transistor SDT are substantially similar or identical to the first active layer ACT1, the first gate electrode G1, the first source electrode S1, and the first drain electrode D1 of the first thin-film transistor ST1 described above with reference to FIG. 7. Accordingly, redundant description will be omitted.

The second light-emitting elements LEL2 of the emission material layer EML are substantially similar or identical to the first light-emitting elements LEL1 of the emission material layer EML described above with reference to FIG. 7. Accordingly, repeated description of the second light-emitting elements LEL2 of the emission material layer EML will be omitted.

The thin-film encapsulation layer TFEL and the sensor electrode layer SENL are substantially similar or identical to those described above with reference to FIG. 7. Accordingly, repeated description of the thin-film encapsulation layer TFEL and the sensor electrode layer SENL will be omitted.

The first pixel connection line PXC1 may be connected to the second drain electrode D2 of the second thin-film transistor ST2 through the first driving contact hole DCT1. The first driving contact hole DCT1 may be a hole penetrating through the first planarization layer 150 to expose the second drain electrode D2 of the second thin-film transistor ST2.

The first pixel connection line PXC1 may extend in the A-direction DRA. The first pixel connection line PXC1 may overlap at least one scan driving transistor SDT in the third direction (z-axis direction).

The pixel electrode 171' of the first emission area EA1' may be connected to the first pixel connection electrode PXC1 through the first pixel contact hole PCT1. The pixel electrode 171' of the first emission area EA1' may be the first pixel electrode 1711 of FIGS. 9 and 10. The pixel electrode 171' of the second emission area EA2' may be connected to the second pixel connection electrode PXC2 through the second pixel contact hole PCT2. The pixel electrode 171' of the second emission area EA2' may be the second pixel electrode 1712 of FIGS. 9 and 10. The pixel electrode 171' of the third emission area EA3' may be connected to the third pixel connection electrode PXC3 through the third pixel contact hole PCT3. The pixel electrode 171' of the third emission area EA3' may be the third pixel electrode 1713 of FIGS. 9 and 10.

The pixel connection electrodes PXC1, PXC2, and PXC3 may be located at the same layer as the first connection electrode ANDE1 (see FIG. 7) and may be made of the same material as the first connection electrode ANDE1 (see FIG. 7). For example, the pixel connection electrodes PXC1, PXC2, and PXC3 may be located on the first planarization layer 150. The second planarization layer 160 may be located on the pixel connection electrodes PXC1, PXC2, and PXC3.

The pixel electrode 171' of the second light-emitting element LEL2 may be connected to the first pixel connection line PXC1 through the first pixel contact hole PCT1. The first pixel contact hole PCT1 may penetrate through the second planarization layer 160 to expose the first pixel connection line PXC1.

The voltage supply line VSL may include a first voltage supply line VSL1, a first voltage connection electrode VCE1, and a third voltage supply line VSL3.

The first voltage supply line VSL1 may be located at the same layer as the pixel electrode 171' of the second light-emitting element LEL2, and may be made of the same material as the pixel electrode 171' of the second light-emitting element LEL2. For example, the first voltage supply line VSL1 may be located on the barrier layer 161. The bank 180 may be located on the first voltage supply line VSL1. The first voltage supply line VSL1 may be made up of a single layer of molybdenum (Mo), titanium (Ti), copper (Cu), or aluminum (Al), or may be made up of a stack structure of aluminum and titanium (Ti/Al/Ti), a stack structure of aluminum and ITO (ITO/Al/ITO), an APC alloy, and/or a stack structure of an APC alloy and ITO (ITO/APC/ITO) to increase reflectivity.

The first voltage supply line VSL1 may overlap the first pixel connection electrode PXC1 in the third direction (z-axis direction). The first voltage supply line VSL1 may overlap at least one scan driving transistor SDT in the third direction (z-axis direction).

In addition, each of the pixel hole PH and the first hole H1 of the first voltage supply line VSL1 may overlap the first pixel connection electrode PXC1 in the third direction (z-axis direction). Each of the pixel hole PH and the first hole H1 of the first voltage supply line VSL1 may overlap at least one scan driving transistor SDT in the third direction (z-axis direction).

The first voltage connection electrode VCE1 may be located at the same layer as the pixel connection electrodes PXC1, PXC2, and PXC3, and may be made of the same material as the pixel connection electrodes PXC1, PXC2, and PXC3. For example, the first voltage connection electrode VCE1 may be located on the first planarization layer 150. The second planarization layer 160 may be located on the first voltage connection electrode VCE1.

The third voltage supply line VSL3 may be located at the same layer as the scan source electrode SS and the scan drain electrode DS of the scan driving transistor SDT, and may be made of the same material as the scan source electrode SS and the scan drain electrode DS of the scan driving transistor SDT. For example, the third voltage supply line VSL3 may be located on the second interlayer dielectric layer. The first planarization layer 150 may be located on the third voltage supply line VSL3. The third voltage supply line VSL3 may be located to overlap the first voltage connection contact hole VCT1 to avoid the scan source electrode SS and the scan drain electrode DS of the scan driving transistor SDT. The first voltage connection electrode VCE1 may be connected to the first voltage supply line VSL1 and the third voltage supply line VSL3 in the first voltage connection contact hole VCT1. In the first voltage connection contact hole VCT1, the first voltage connection electrode VCE1 may be located on the third voltage supply line VSL3, the first voltage supply line VSL1 may be located on the first voltage connection electrode VCE1, and the common electrode 173' may be located on the first voltage supply line VSL1. In the first voltage connection contact hole VCT1, the third voltage supply line VSL3 may be in contact with the first voltage connection electrode VCE1, the first voltage supply line VSL1 may be in contact with the first voltage connection electrode VCE1, and the common electrode 173' may be in contact with the first voltage supply line VSL1.

The first voltage connection contact hole VCT1 may penetrate through the first planarization layer 150, the second planarization layer 160, and the bank 180 to expose the third voltage supply line VSL3.

As shown in FIGS. 11 and 12, to reduce or prevent recognition, by a user, of a gap between the images displayed by the first display area DA1 and the images displayed by the third display area DA3, the second display area DA2 may include the second pixels PX2 to display images. At this time, because each of the second pixels PX2 is located in the pixel hole PH of the first voltage supply line VSL1 in the second display area DA2, the second pixels PX2 may be located so that they avoid the first voltage supply line VSL1.

In addition, the second thin-film transistors ST2 for supplying driving current or driving voltage to the second light-emitting elements LEL2 of the second pixels PX2 may be located to be distant from the scan driving transistors SDT of the scan driver for supplying scan signals to the scan lines. In such case, the pixel electrode 171' of the second light-emitting element LEL2 may be connected to the second drain electrode D2 of the second thin-film transistor ST2 through the pixel connection line PXC1. Accordingly, the second thin-film transistors ST2 may be located so that they avoid the scan driving transistors SDT of the scan driver located in the second display area DA2.

Figure 13:
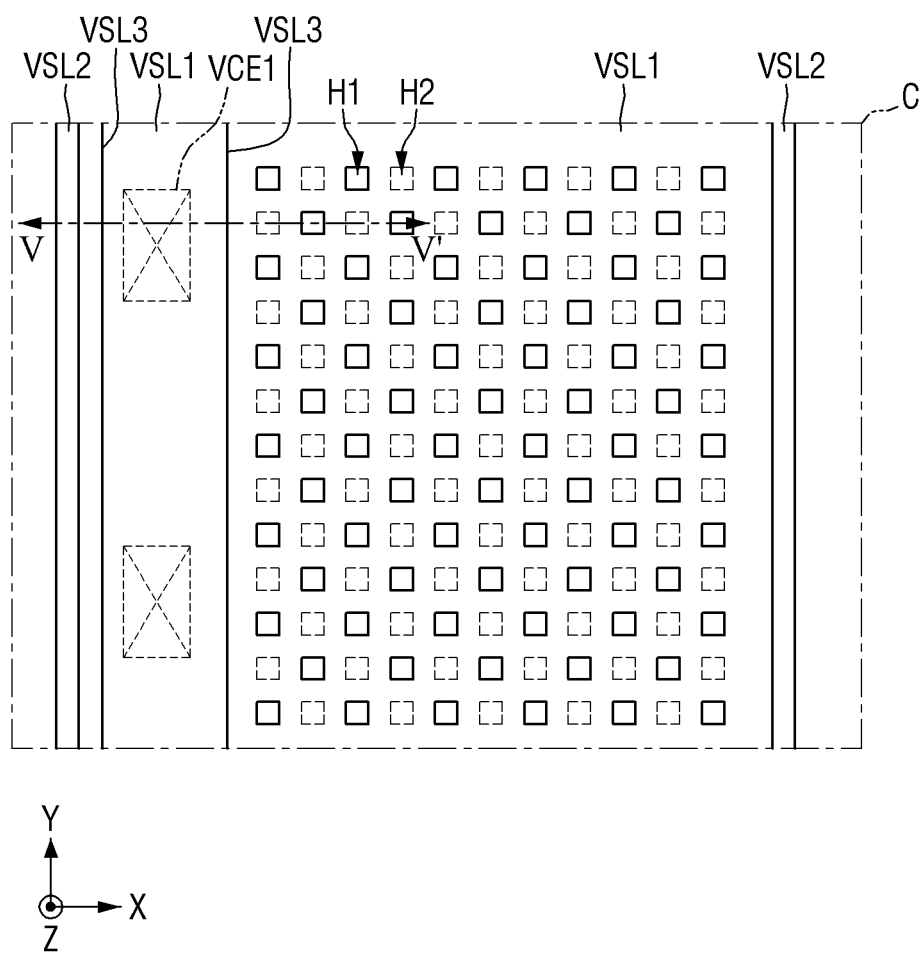
FIG. 13 is a layout diagram showing the non-display area of FIG. 5 according to some embodiments.

FIG. 13 is a layout diagram showing the non-display area of FIG. 5 according to some embodiments.

Referring to FIG. 13, the voltage supply line VSL may include a first voltage supply line VSL1, a second voltage supply line VSL2 and a third voltage supply line VSL3 in the non-display area NDA. The first voltage supply line VSL1, the second voltage supply line VSL2, and the third voltage supply line VSL3 may overlap one another in the third direction (z-axis direction).

Because the second pixels PX2 are not located in the non-display area NDA, the first voltage supply line VSL1 includes no pixel hole PH in the non-display area NDA. The first voltage supply line VSL1 may include first holes H1 in the non-display area NDA. The first holes H1 may be arranged in the A-direction DRA and the B-direction DRB. That is to say, the first holes H1 may be arranged in a matrix pattern. Because the second planarization layer 160 is made of an organic layer, the first holes H1 may be outgas paths of the organic layer.

The second voltage supply line VSL2 may include second holes H2 in the non-display area NDA. The second holes H2 may be arranged in the A-direction DRA and the B-direction DRB. That is to say, the second holes H2 may be arranged in a matrix pattern. Because the first planarization layer 150 is made of an organic layer, the second holes H2 may provide paths for outgassing for the organic layer. Because the gas of the organic layer can be discharged through the first holes H1 and the second holes H2, it is possible to prevent or suppress damage to the light emitting layers 172 and 172' of the light-emitting elements LEL1 and LEL2 that may be otherwise caused by the gas of the organic layer.

The first holes H1 and the second holes H2 may be alternately arranged in the A-direction DRA. For example, they may be arranged in the A-direction DRA in the order of a first hole H1, a second hole H2, a first hole H1, a second hole H2, and so on. Also, the first holes H1 and the second holes H2 may be alternately arranged in the B-direction DRB. For example, they may be arranged in the B-direction DRB in the order of a first hole H1, a second hole H2, a first hole H1, a second hole H2, and so on.

The width of the third voltage supply line VSL3 may be smaller than the width of the first voltage supply line VSL1. The width of the third voltage supply line VSL3 may be smaller than the width of the second voltage supply line VSL2. The third voltage supply line VSL3 might not overlap with the first holes H1 and the second holes H2 in the third direction (z-axis direction). The third voltage supply line VSL3 may be located to be closer to the outer part of, than to the inner part of, the first voltage supply line VSL1. The inner part of the first voltage supply line VSL1 refers to the side adjacent to the first display area DA1, whereas the outer part thereof refers to the side adjacent to the edge of the substrate SUB.

Figure 14:
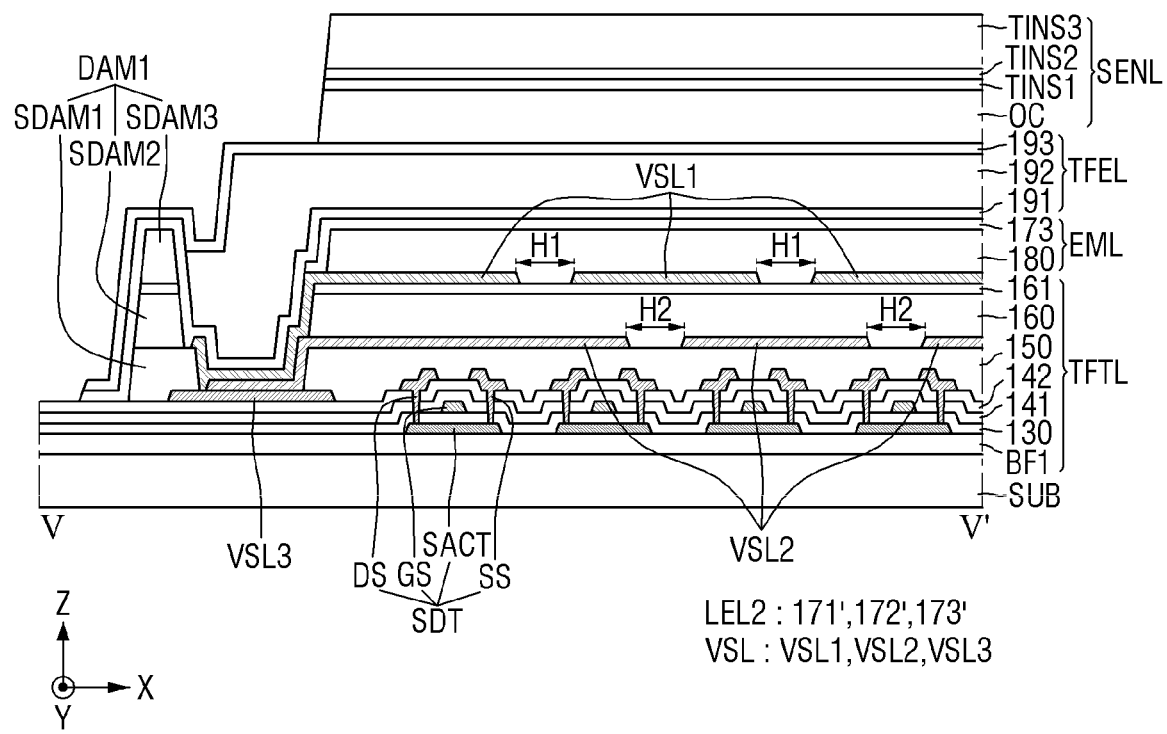
FIG. 14 is a cross-sectional view showing the display panel taken along the line V-V of FIG. 13 according to some embodiments.

FIG. 14 is a cross-sectional view showing the display panel taken along the line V-V' of FIG. 13 according to some embodiments.

Referring to FIG. 14, the thin-film transistor layer TFTL may include scan driving transistors SDT of the scan driver.

The scan driving transistor SDT may include a scan active layer SACT, a scan gate electrode GS, a scan source electrode SS, and a scan drain electrode DS. The scan active layer SACT, the scan gate electrode GS, the scan source electrode SS, and the scan drain electrode DS of the scan driving transistor SDT are substantially similar or identical to the first active layer ACT1, the first gate electrode G1, the first source electrode S1, and the first drain electrode D1 of the first thin-film transistor ST1 described above with reference to FIG. 7. Accordingly, redundant description will be omitted.

The voltage supply line VSL may include a first voltage supply line VSL1, a second voltage supply line VSL2, and a third voltage supply line VSL3.

The first voltage supply line VSL1 may be located at the same layer as the pixel electrode 171' of the second light emitting element LEL2, and may be made of the same material as the pixel electrode 171' of the second light emitting element LEL2. At least one of the first holes H1 of the first voltage supply line VSL1 may overlap the scan driving transistor SDT in the third direction (z-axis direction).

The second voltage supply line VSL2 may be located at the same layer as the first connection electrode ANDE1 (see FIG. 7), and may be made of the same material as the first connection electrode ANDE1 (see FIG. 7). At least one of the second holes H2 of the second voltage supply line VSL2 may overlap the scan driving transistor SDT in the third direction (z-axis direction).

The third voltage supply line VSL3 may be located at the same layer as the scan source electrode SS and the scan drain electrode DS of the scan driving transistor SDT, and may be made of the same material as the scan source electrode SS and the scan drain electrode DS of the scan driving transistor SDT. The third voltage supply line VSL3 may be located to overlap the first voltage connection contact hole VCT1 to avoid the scan source electrode SS and the scan drain electrode DS of the scan driving transistor SDT.

The first voltage supply line VSL1, the second voltage supply line VSL2, and the third voltage supply line VSL3 may be connected to one another through the first voltage connection contact hole VCT1. In the first voltage connection contact hole VCT1, the second voltage supply line VSL2 may be located on the third voltage supply line VSL3, and the first voltage supply line VSL1 may be located on the second voltage supply line VSL2. In the first voltage connection contact hole VCT1, the third voltage supply line VSL3 may be in contact with the second voltage supply line VSL2, and the first voltage supply line VSL1 may be in contact with the second voltage supply line VSL2. The first voltage connection contact hole VCT1 may penetrate through the first planarization layer 150, the second planarization layer 160, and the bank 180 to expose the third voltage supply line VSL3.

As shown in FIGS. 13 and 14, because the second pixels PX2 are not located in the non-display area NDA, the first voltage supply line VSL1 includes no pixel hole PH. In addition, because it is not necessary to connect the second thin-film transistor ST2 of the pixel driver PXD with the pixel electrodes 171' of the second pixels PX2 in the non-display area NDA, no pixel connection lines PXC are required. Therefore, the second voltage supply line VSL2 may be located in the non-display area NDA instead of the pixel connection lines PXC, and thus the resistance of the voltage supply line VSL can be lowered.

Figure 15:
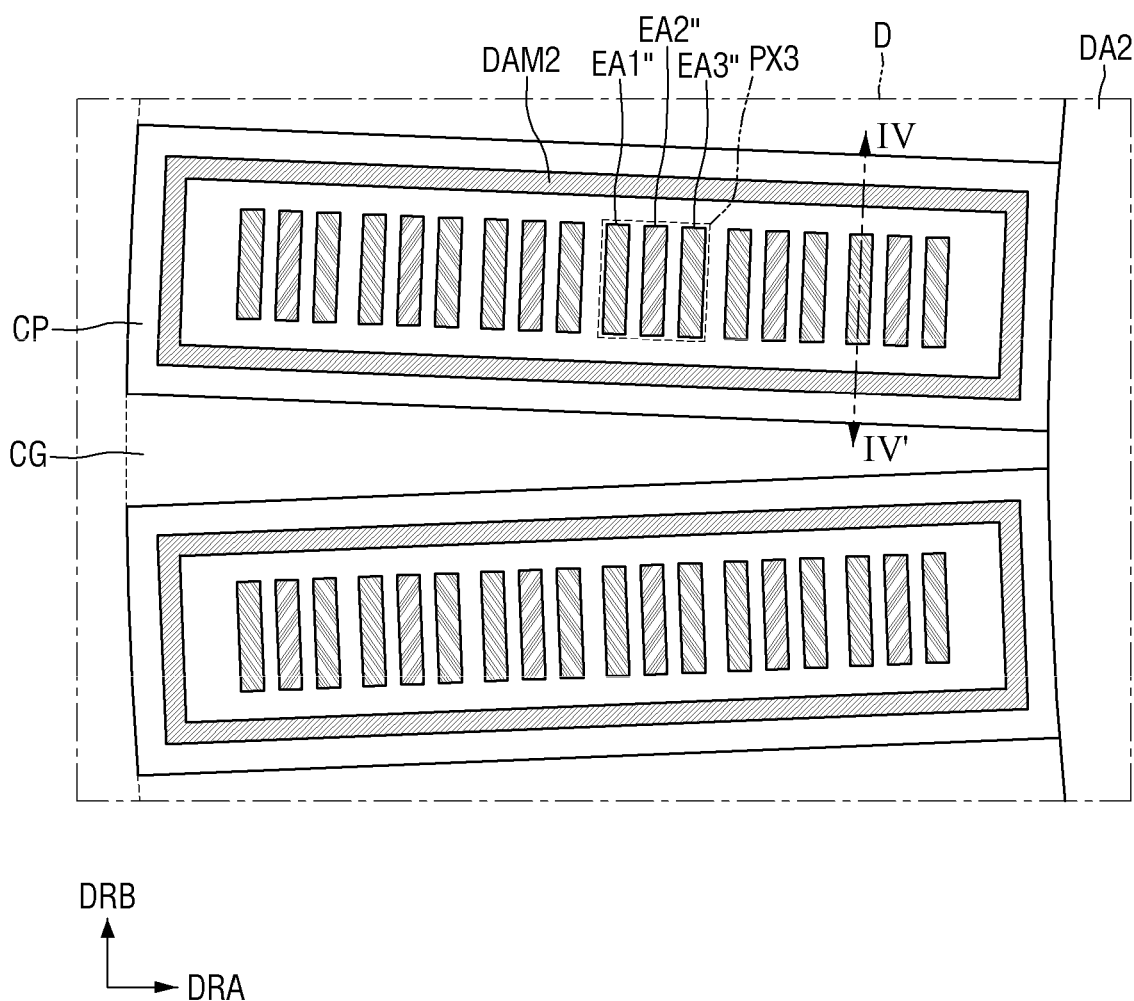
FIG. 15 is a layout diagram showing the third display area of FIG. 5 according to some embodiments.

FIG. 15 is a layout diagram showing the third display area of FIG. 5 according to some embodiments.

Referring to FIG. 15, the third display area DA3 may include cut patterns CP and cutting grooves CG. The cut patterns CP may be formed by cutting the display panel 300 with a laser. Accordingly, the cutting grooves CG may be formed between cut patterns CP that are adjacent to each other. One end of each of the cut patterns CP may be connected to the second display area DA2, and the other end thereof may be connected to the non-display area NDA.

Third pixels PX3 and a dam DAM2 may be located in each of the cut patterns CP.

The third pixels PX3 may be arranged in the A-direction DRA. Each of the third pixels PX3 may include a plurality of emission areas EA1", EA2", and EA3". The emission areas EA1", EA2", and EA3" of each of the third pixels PX3 may be substantially similar or identical to the emission areas EA1', EA2', and EA3' of each of the second pixels PX2. Therefore, repeated description of the emission areas EA1", EA2", and EA3" of each of the third pixels PX3 will be omitted.

The dam DAM2 may be located to surround the third pixels PX3. The dam DAM2 may be located at or near the edges of each of the cut patterns CP.

As shown in FIG. 15, when the third display area DA3 includes the cut patterns CP and the cutting grooves CG, there may be space between the cut patterns CP adjacent to each other due to the cutting grooves CG. Accordingly, even if the first corner portion CS1 has a double curvature, the first corner portion CS1 can stretch and contract, so that strain applied to the first corner portion CS1 can be reduced by virtue of the cutting grooves CG.

Figure 16:
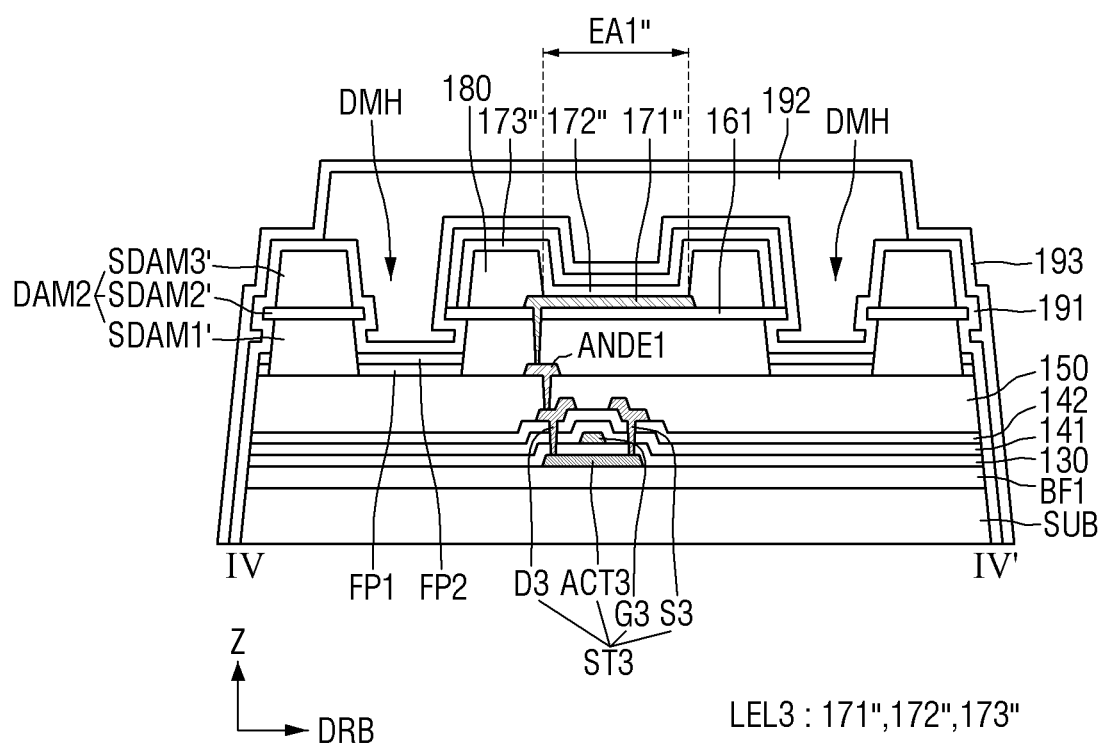
FIG. 16 is a cross-sectional view showing the display panel taken along the line VI-VI' of FIG. 15 according to some embodiments.

FIG. 16 is a cross-sectional view showing the display panel taken along the line VI-VI' of FIG. 15 according to some embodiments.

Referring to FIG. 16, the thin-film transistor layer TFTL may include third thin-film transistors ST3. The third thin-film transistor ST3 may include a third active layer ACT3, a third gate electrode G3, a third source electrode S3, and a third drain electrode D3. The third active layer ACT3, the third gate electrode G3, the third source electrode S3, and the third drain electrode D3 of the third thin-film transistor ST3 are substantially similar or identical to the first active layer ACT1, the first gate electrode G1, the first source electrode S1, and the first drain electrode D1 of the first thin-film transistor ST1 described above with reference to FIG. 7, respectively. Accordingly, repeated description of the third thin-film transistor ST3 will be omitted.

The third light-emitting elements LEL3 of the emission material layer EML are substantially similar or identical to the first light-emitting elements LEL1 of the emission material layer EML described above with reference to FIG. 7. Accordingly, repeated description of the third light-emitting elements LEL3 of the emission material layer EML will be omitted.

The thin-film encapsulation layer TFEL and the sensor electrode layer SENL are substantially similar or identical to those described above with reference to FIG. 7. Accordingly, repeated description of the thin-film encapsulation layer TFEL and the sensor electrode layer SENL will be omitted.

The dam DAM2 may include a first sub-dam SDAM1' made of the same material as the second planarization layer 160, a second sub-dam SDAM2' made of the same material as the barrier layer 161, and a third sub-dam SDAM3' made of the same material as the bank 180. The dam DAM2 may further include a fourth sub-dam located on the third sub-dam SDAM3' in other embodiments.

A dam hole DMH may be formed on the inner side of the dam DAM2. The dam hole DMH may be formed into an undercut profile. The undercut profile refers to a hole in which the inlet is smaller than the bottom, or a hole in which the inlet is smaller than the area between the inlet and the bottom. A hole in the undercut profile may resemble a pot, or eaves of a roof. For example, the entrance of the dam hole DMH may be defined by the barrier layer 161. The lower surface of the barrier layer 161 of the second planarization layer 160 might not be covered by the second planarization layer 160. Accordingly, the size of the inlet of the dam hole DMH may be smaller than the size of an area between the inlet and the bottom of the dam hole DMH.

In the dam hole DMH, a first floating pattern FP1, a second floating pattern FP2, and a first inorganic encapsulation layer 191 are located. The dam hole DMH may be filled with the organic encapsulation layer 192. It is to be noted that a light emitting layer 172" and a common electrode 173" may have poor step coverage. Therefore, when the dam hole DMH is formed into the undercut profile, the light emitting layer 172" and the common electrode 173" might not be located on the sidewalls of the dam hole DMH. Accordingly, the light emitting layer 172" and the common electrode 173" may be disconnected at the dam hole DMH. The step coverage refers to the ability of subsequent layers to evenly cover levels (e.g., "steps") already present on the substrate without being disconnected.

The first floating pattern FP1 may be located on the second planarization layer 160 in the dam hole DMH. The first floating pattern FP1 may be a residual layer of the light emitting layer 172" that is not connected to the light emitting layer 172" but instead is disconnected from it. The first floating pattern FP1 may be made of the same material as the light emitting layer 172". When the size of the dam hole DMH is small, the first floating pattern FP1 might not exist.

In addition, the second floating pattern FP2 may be located on the first floating pattern FP1 in the dam hole DMH. The second floating pattern FP2 may be a residual layer of the common electrode 173" that is not connected to the common electrode 173" but instead is disconnected from it. The second floating pattern FP2 may be made of the same material as the common electrode 173". When the size of the dam hole DMH is small, the second floating pattern FP2 might not exist.

In addition, the first inorganic encapsulation layer 191 and the second inorganic encapsulation layer 193 may be located on the cut surfaces or side surface portions of the cut pattern CP. For example, the first inorganic encapsulation layer 191 and the second inorganic encapsulation layer 193 may be located on the cut surfaces or side surface portions of the substrate SUB, the first buffer layer BF1, the gate insulator 130, the first interlayer dielectric layer 141, the second interlayer dielectric layer 142, and the first planarization layer 150 of the cut pattern CP. Accordingly, it is possible to reduce or prevent damage to the light emitting layer 172" which otherwise may occur when moisture or oxygen is introduced through the cut surfaces or side surface portions of the cut pattern CP.

Figure 17:
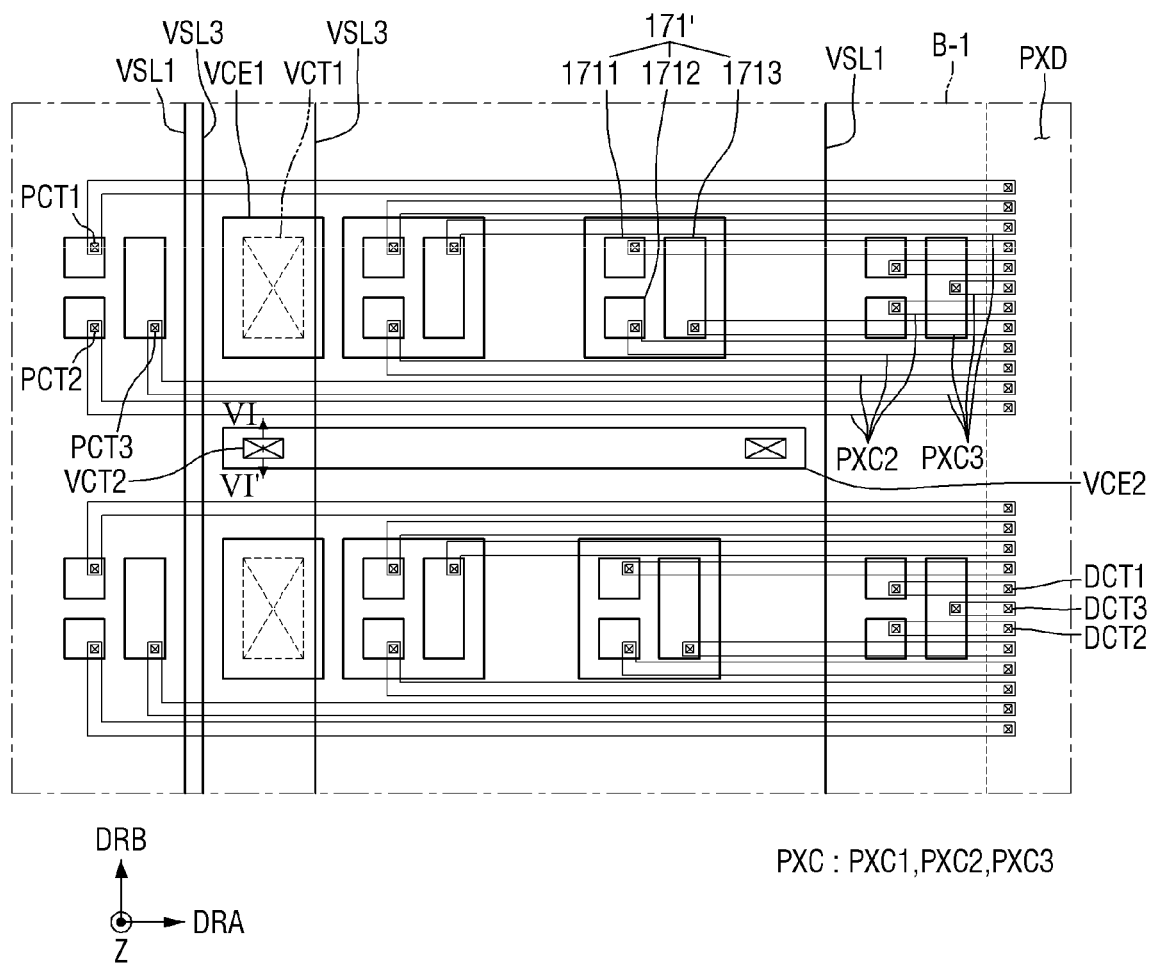
FIG. 17 is an enlarged layout diagram showing the first voltage supply line, voltage connection electrodes, voltage connection contact holes, pixel electrodes of second pixels, and common connection electrodes in area B-1 of FIG. 8 according to some embodiments.

FIG. 17 is an enlarged layout diagram showing a common electrode, second pixel electrodes, voltage connection contact holes, pixel connection lines, and common connection electrodes in area B-1 of FIG. 8 according to some embodiments.

The embodiments corresponding to FIG. 17 are different from the embodiments corresponding to FIG. 10 in that the voltage supply line VSL further includes the second voltage connection electrode VCE2. Description will focus on the difference.

Referring to FIG. 17, the second voltage connection electrode VCE2 may be located between second pixels PX2 that are adjacent to each other in the B-direction DRB. The second voltage connection electrode VCE2 may be located between the first voltage connection contact holes VCT1 adjacent to each other in the B-direction DRB. The second voltage connection electrode VCE2 may extend in the A-direction DRA.

The second voltage connection electrode VCE2 may overlap the first voltage supply line VSL1 in the third direction (z-axis direction). The second voltage connection electrode VCE2 might not overlap with the second pixels PX2, the first voltage connection electrodes VCE1, and the pixel connection lines PXC in the third direction (z-axis direction). The first voltage supply line VSL1 may be connected to the second voltage connection electrode VCE2 through at least a second voltage connection contact hole VCT2.

Figure 18:
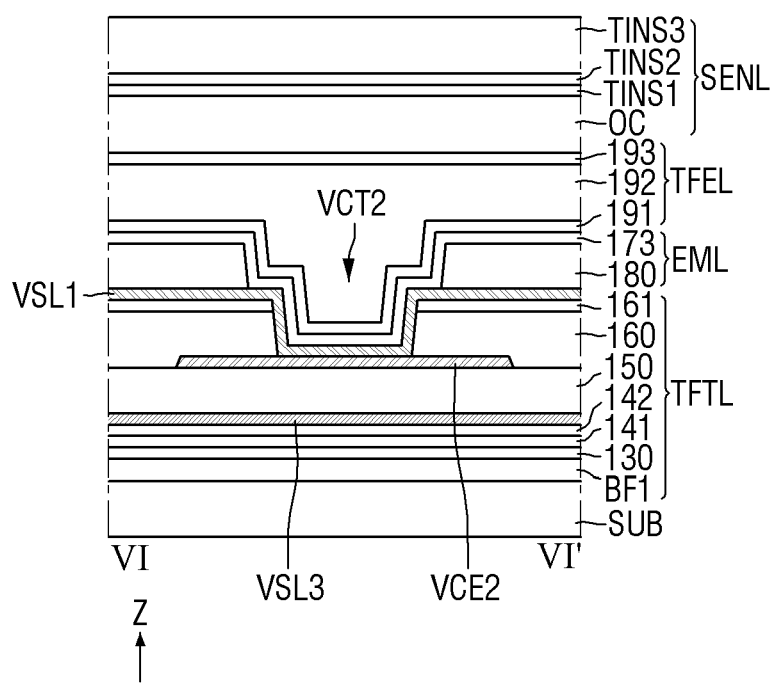
FIG. 18 is a cross-sectional view showing a display panel taken along the line VII-VII' of FIG. 17 according to some embodiments.

FIG. 18 is a cross-sectional view showing a display panel taken along the line VII-VII' of FIG. 17 according to some embodiments.

Referring to FIG. 18, the second voltage connection electrode VCE2 may be located at the same layer as the first voltage connection electrode VCE1 and the pixel connection electrodes PXC1, PXC2, and PXC3, and may be made of the same material as the first voltage connection electrode VCE1 and the pixel connection electrodes PXC1, PXC2, and PXC3. For example, the second voltage connection electrode VCE2 may be located on the first planarization layer 150. The second planarization layer 160 may be located on the second voltage connection electrode VCE2.

The first voltage supply line VSL1, the second voltage connection electrode VCE2, and the common electrode 173' may be connected to one another through the second voltage connection contact hole VCT2. In the second voltage connection contact hole VCT2, the first voltage supply line VSL1 may be located on the second voltage connection electrode VCE2, and the common electrode 173' may be located on the first voltage supply line VSL1. In the second voltage connection contact hole VCT2, the first voltage supply line VSL1 may be in contact with the second voltage connection electrode VCE2, and the common electrode 173' may be in contact with the first voltage supply line VSL1. The second voltage connection contact hole VCT2 may penetrate through the second planarization layer 160 and the bank 180 to expose the second voltage connection electrode VCE2.

As shown in FIGS. 17 and 18, the voltage supply line VSL further includes the second voltage connection electrode VCE2 connected to the first voltage supply line VSL1 through the second voltage connection contact hole VCT2, so that the resistance of the voltage supply line VSL can be lowered.

Although some embodiments of the present disclosure have been disclosed for illustrative purposes, those skilled in the art will appreciate that various modifications, additions and substitutions are possible, without departing from the scope and spirit of the disclosure as defined by the accompanying claims and equivalents thereof.

What is claimed is:

1. A display device comprising:
    a substrate comprising a front surface portion, a first side surface portion extending from a first side of the front surface portion, a second side surface portion extending from a second side of the front surface portion, and a corner portion between the first side surface portion and the second side surface portion;
    a first display area on the front surface portion of the substrate, and comprising a first pixel for displaying images; and
    a second display area on the corner portion of the substrate, and comprising a first voltage supply line, and a second pixel for displaying images, the second pixel comprising:
        a first pixel electrode;
        a first light emitting layer on the first pixel electrode; and
        a common electrode on the first light emitting layer,
    wherein the first voltage supply line does not overlap the first pixel electrode in a thickness direction of the substrate, and
    wherein the second pixel is between an adjacent edge of the substrate, which is closest to the second pixel among edges of the substrate, and the first voltage supply line.

2. A display device comprising:
    a substrate comprising a front surface portion, a first side surface portion extending from a first side of the front surface portion, a second side surface portion extending from a second side of the front surface portion, and a corner portion between the first side surface portion and the second side surface portion;
    a first display area on the front surface portion of the substrate, and comprising a first pixel for displaying images; and
    a second display area on the corner portion of the substrate, and comprising a first voltage supply line, and a second pixel for displaying images, the second pixel comprising:
        a first pixel electrode;
        a first light emitting layer on the first pixel electrode; and
        a common electrode on the first light emitting layer,
    wherein the first voltage supply line does not overlap the first pixel electrode in a thickness direction of the substrate, and
    wherein the first voltage supply line defines a pixel hole in which the first pixel electrode is located.

3. The display device of claim 2, wherein the first voltage supply line further defines a first hole spaced from the pixel hole.

4. The display device of claim 3, wherein a size of the pixel hole is larger than a size of the first hole.

5. The display device of claim 3, wherein the second pixel further comprises:
    a second pixel electrode spaced from the first pixel electrode; and
    a second light emitting layer on the second pixel electrode.

6. The display device of claim 5, wherein the second pixel electrode is in another pixel hole apart from the pixel hole.

7. The display device of claim 5, further comprising a transistor between the first display area and the second display area, and configured to drive the second pixel.

8. The display device of claim 7, further comprising:
    a first planarization layer on the transistor;
    pixel connection lines on the first planarization layer; and
    a second planarization layer on the pixel connection lines.

9. The display device of claim 8, wherein the first pixel electrode and the second pixel electrode are on the second planarization layer, and
    wherein the pixel connection lines comprise:
        a first pixel connection line connected to the first pixel electrode through a first pixel contact hole penetrating the second planarization layer; and
        a second pixel connection line connected to the second pixel electrode through a second pixel contact hole penetrating the second planarization layer.

10. The display device of claim 9, wherein the first pixel connection line overlaps the second pixel electrode in the thickness direction of the substrate.

11. The display device of claim 9, wherein the first pixel connection line and the second pixel connection line overlap the first voltage supply line in the thickness direction of the substrate.

12. The display device of claim 8, further comprising a first voltage connection electrode on the first planarization layer, and connected to the first voltage supply line through a first voltage connection contact hole penetrating through the first planarization layer and the second planarization layer.

13. The display device of claim 12, wherein the first pixel electrode and the second pixel electrode do not overlap the first voltage connection electrode in the thickness direction of the substrate.

14. The display device of claim 12, further comprising:
    an active layer of the transistor on the substrate;
    a gate insulator on the active layer of the transistor;
    a gate electrode of the transistor on the gate insulator;
    a first insulating layer on the gate electrode of the transistor;
    a source electrode of the transistor on the first insulating layer, and connected to the active layer of the transistor through a source contact hole penetrating the first insulating layer; and
    a drain electrode of the transistor on the first insulating layer, and connected to the active layer of the transistor through a drain contact hole penetrating the first insulating layer.

15. The display device of claim 14, further comprising a second voltage supply line connected to the first voltage supply line through the first voltage connection contact hole in a non-display area of the first side surface portion.

16. The display device of claim 15, wherein the first planarization layer is on the source electrode and the drain electrode of the transistor, and wherein the second voltage supply line is on the first planarization layer.

17. The display device of claim 15, further comprising a third voltage supply line connected to the first voltage supply line through the first voltage connection contact hole in the second display area, and located in the non-display area of the first side surface portion.

18. The display device of claim 17, wherein the third voltage supply line is on the first insulating layer.

19. The display device of claim 8, wherein the first display area further comprises scan lines extending in a direction, and
wherein the second display area further comprises scan driving transistors for outputting scan signals to the scan lines.

20. The display device of claim 19, wherein at least one of the first pixel electrode and the second pixel electrode overlaps at least one of the scan driving transistors in the thickness direction of the substrate.

21. The display device of claim 19, wherein the first voltage supply line overlaps at least one of the scan driving transistors in the thickness direction of the substrate.

22. A display device comprising:
- a substrate comprising a front surface portion, a first side surface portion extending from a first side of the front surface portion, a second side surface portion extending from a second side of the front surface portion, and a corner portion between the first side surface portion and the second side surface portion;
- a first display area on the front surface portion of the substrate, and comprising a first pixel for displaying images;
- a second display area on the corner portion of the substrate, and comprising a first voltage supply line and a second pixel for displaying images;
- a transistor between the first display area and the second display area, and configured to drive the second pixel; and
- a pixel connection line for connecting a pixel electrode of the second pixel to a source electrode or a drain electrode of the transistor.

23. The display device of claim 22, wherein the pixel connection line overlaps the first voltage supply line in a thickness direction of the substrate.

* * * * *